United States Patent
Jeong et al.

(10) Patent No.: US 9,450,704 B2
(45) Date of Patent: Sep. 20, 2016

(54) TRANSMITTING APPARATUS, INTERLEAVING METHOD THEREOF, RECEIVING APPARATUS, AND DEINTERLEAVING METHOD THEREOF

(71) Applicant: SAMSUNG ELECTRONICS CO., LTD., Suwon-si (KR)

(72) Inventors: Hong-sil Jeong, Suwon-si (KR); Se-ho Myung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 3 days.

(21) Appl. No.: 14/246,296

(22) Filed: Apr. 7, 2014

(65) Prior Publication Data

US 2014/0310577 A1 Oct. 16, 2014

Related U.S. Application Data

(60) Provisional application No. 61/809,479, filed on Apr. 8, 2013.

(30) Foreign Application Priority Data

Sep. 17, 2013 (KR) .......................... 10-2013-0112199

(51) Int. Cl.
*H04L 1/00* (2006.01)
*H03M 13/11* (2006.01)
(Continued)

(52) U.S. Cl.
CPC ........ *H04L 1/0041* (2013.01); *H03M 13/1165* (2013.01); *H03M 13/255* (2013.01);
(Continued)

(58) Field of Classification Search
CPC ......... H03M 13/271; H03M 13/2792; H03M 13/255; H03M 13/616; H03M 13/1165; H04L 1/0041; H04L 1/0045
USPC ........................................ 714/704, 752, 776
See application file for complete search history.

(56) References Cited

U.S. PATENT DOCUMENTS

2009/0063929 A1* 3/2009 Jeong ................. H03M 13/1165
714/752
2009/0125781 A1* 5/2009 Jeong et al. .................. 714/752
(Continued)

FOREIGN PATENT DOCUMENTS

EP 2518923 A1 10/2012
KR 10-0876791 B1 1/2009
(Continued)

OTHER PUBLICATIONS

"Digital Video Broadcasting (DVB); Second generation framing structure, channel coding and modulation systems for Broadcasting, Interactive Services, News Gathering and other broadband satellite applications (DVB-S2)", published Mar. 2013, ETSI, V1.3.1, pp. 23-26.*

(Continued)

*Primary Examiner* — Cynthia Britt
*Assistant Examiner* — Sazzad Hossain
(74) *Attorney, Agent, or Firm* — Sughrue Mion, PLLC

(57) ABSTRACT

A transmitting apparatus and method, and a receiving apparatus and method are provided. The transmitting apparatus includes: an encoder configured to perform encoding on data including information bits; and a bit interleaver configured to perform interleaving on the information bits and parity bits generated by the encoding, wherein the bit interleaver is configured to classify the generated parity bits into a plurality of groups and write the information bits and the generated parity bits in a plurality of columns in a column direction such that parity bits included in a predetermined group among the plurality of groups are arranged in predetermined positions in the plurality of columns, to perform the interleaving.

20 Claims, 14 Drawing Sheets

(51) Int. Cl.
*H03M 13/25* (2006.01)
*H03M 13/27* (2006.01)
*H03M 13/00* (2006.01)

(52) U.S. Cl.
CPC ....... *H03M13/271* (2013.01); *H03M 13/2792* (2013.01); *H03M 13/616* (2013.01); *H04L 1/0045* (2013.01); *H04L 1/004* (2013.01)

(56) References Cited

U.S. PATENT DOCUMENTS

| | | | | |
|---|---|---|---|---|
| 2009/0204869 | A1* | 8/2009 | Myung | H03M 13/1165 714/752 |
| 2009/0307540 | A1* | 12/2009 | Razazian | H04B 3/143 714/701 |
| 2010/0124940 | A1* | 5/2010 | Hassan et al. | 455/509 |
| 2010/0232338 | A1 | 9/2010 | Krishnamoorthi | |
| 2010/0275090 | A1* | 10/2010 | Kuri | H03M 13/1185 714/752 |
| 2010/0306627 | A1* | 12/2010 | Sakai | H03M 13/116 714/781 |
| 2010/0325512 | A1* | 12/2010 | Yokokawa | H03M 13/1137 714/752 |
| 2011/0119568 | A1* | 5/2011 | Jeong | H03M 13/1185 714/790 |
| 2012/0051460 | A1* | 3/2012 | Jeong | H03M 13/1165 375/298 |
| 2012/0246534 | A1 | 9/2012 | Kang et al. | |
| 2013/0055049 | A1 | 2/2013 | Murakami | |

FOREIGN PATENT DOCUMENTS

| | | |
|---|---|---|
| KR | 10-2011-0134899 A | 12/2011 |
| WO | 2006/087792 A1 | 8/2006 |
| WO | 2007081165 A1 | 7/2007 |

OTHER PUBLICATIONS

Yokokawa et al. "Parity and Column Twist Bit Interleaver for DVB-T2 LDPC Codes" XP 031353674; 5th International Symposium on Turbo Codes and Related Topics; Sep. 1, 2008; pp. 123-127.

"Digital Video Broadcasting (DVB); Second generation framing structure, channel coding and modulation systems for Broadcasting, Interactive Services, News Gathering and other broadband satellite applications (DVB-S2)", XP 014156243; European Standard; European Telecommunications Standard Institute (ETSI); Mar. 1, 2013; 84 pages total; vol. Broadcas No. V1.3.1; Sophia-Antipolis, FR.

International Search Report dated Jun. 25, 2014 issued by the International Searching Authority, in counterpart International Patent Application No. PCT/KR2014/003049 (PCT/ISA/210).

Written Opinion dated Jun. 25, 2014 issued by the International Searching Authority, in counterpart International Patent Application No. PCT/KR2014/003049 (PCT/ISA/237).

Communication dated Jul. 18, 2014, issued by the European Patent Office, in counterpart European Application No. 14163785.0.

Communication issued Sep. 18, 2015, issued by the European Patent Office in counterpart European Patent Application No. 14163785.0.

* cited by examiner

TRANSMITTING APPARATUS, INTERLEAVING METHOD THEREOF, RECEIVING APPARATUS, AND DEINTERLEAVING METHOD THEREOF

CROSS-REFERENCE TO RELATED APPLICATION(S)

This application claims priority under 35 U.S.C. §119 from U.S. Provisional Patent Application No. 61/809,479, filed on Apr. 8, 2013, in the United States Patent and Trademark Office, and Korean Patent Application No. 10-2013-0112199, filed on Sep. 17, 2013, in the Korean Intellectual Property Office, the disclosures of which are incorporated herein in their entirety by reference.

BACKGROUND

1. Field

The present general inventive concept generally relates to providing a transmitting apparatus, an interleaving method thereof, a receiving apparatus, and a deinterleaving method thereof, and more particularly, to providing a transmitting apparatus that interleaves and transmits data and a parity bit thereof, and receives and deinterleaves the data and the parity bit, an interleaving method thereof, a receiving apparatus, and a deinterleaving method.

2. Description of the Related Art

In the 21st century information society, broadcasting communication services have received the age of full-scale digitization, multi-channel, broadband, and high quality broadcasting. In particular, as high-definition digital TVs, portable multimedia players, portable broadcasting apparatuses, etc. are extensively distributed, digital broadcasting services have increasingly demanded various types of receiving method supports.

To meet this demand, the Digital Video Broadcasting-Second Generation Terrestrial (DVB-T2) has been provided as a terrestrial digital broadcasting standard that is established by improving the Digital Video Broadcasting-Terrestrial (DVB-T). The DVB-T2 maintains compatibility with the DVB-T, increases transmission efficiency, uses the MPEG-4 AVC as a compression method, uses a modulation method that is improved through an addition of a 256-quadrature amplitude modulation (256-QAM) to an existing modulation method, uses transmission modes of 1K, 4K, 16K, and 32K, and uses low-density parity-check codes (LDPC) as forward error correction (FEC).

In particular, the DVB-T2 uses a bit interleaver that interleaves data coded by the LDPC, and requires an interleaving method capable of improving an LDPC encoding performance in a channel environment in which a burst error occurs, and a deinterleaving method corresponding to the interleaving method.

SUMMARY

One or more exemplary embodiments address at least the above problems and/or disadvantages and other disadvantages not described above. However, the exemplary embodiments are not required to overcome the disadvantages described above, and may not overcome any of the problems described above.

The exemplary embodiments provide a transmitting apparatus that improves an LDPC coding performance, an interleaving method thereof, a receiving apparatus, and a deinterleaving method.

According to an aspect of the exemplary embodiments, there is provided a transmitting apparatus including: an encoder configured to perform encoding on data including information bits; and a bit interleaver configured to perform interleaving on the information bits and parity bits generated by the encoding, wherein the bit interleaver is configured to classify the generated parity bits into a plurality of groups and write the information bits and the generated parity bits in a plurality of columns in a column direction such that parity bits included in a predetermined group among the plurality of groups are arranged in predetermined positions in the plurality of columns, to perform the interleaving.

The bit interleaver may write the information bits and the generated parity bits in the plurality of columns such that parity bits arranged at a preset interval after the encoding and before the interleaving are written in same rows of the plurality of columns.

The bit interleaver may adjust a start position of at least one of the plurality of columns in which an information bit of the data and/or a parity bit among the generated parity bits is first written such that the parity bits arranged at the preset interval are written in the same rows of the plurality of columns.

The bit interleaver may is configured to write the information bits in the plurality of columns, and then write the generated parity bits in the plurality of columns.

The bit interleaver may sequentially write the generated parity bits in the plurality of columns in a reverse order, and then write the information bits in the plurality of columns in a reverse order in view of an order of the information bits and the generated bits after the encoding and before the interleaving.

According to another aspect of the exemplary embodiments, there is provided a transmitting method at a transmitting apparatus. The method may include: performing encoding on data including information bits; classifying parity bits generated by the encoding into a plurality of groups; and performing interleaving on the information bits and the generated parity bits by writing the information bits and the generated bits in a plurality of columns in a column direction such that parity bits included in a predetermined group among the plurality of groups are arranged in predetermined positions in the plurality of columns.

The parity bits included in the predetermined groups may be parity bits arranged at a preset interval after the encoding and before the interleaving, and wherein the predetermined positions are same rows of the plurality of columns.

The writing may be performed by adjusting a start position of at least one column, among the plurality of columns, in which an information bit of the data and/or a parity bit among the generated parity bits is first written such that the parity bits arranged at the preset interval are written in same rows of the plurality of columns.

The writing may include writing the information bits in the plurality of columns, and then writing the parity bits in the plurality of columns.

The writing may include writing the generated parity bits in the plurality of columns in a reverse order, and then writing the information bits in the plurality of columns in a reverse order in view of an order of the information bits and the generated bits after the encoding and before the interleaving.

According to another aspect of the exemplary embodiments, there is provided a receiving apparatus including: a demodulator configured to demodulate a signal to generate a value corresponding to a codeword; a bit deinterleaver configured to perform deinterleaving by writing the value corresponding to the codeword in a plurality of rows and reading from a plurality of columns of the plurality of rows to perform deinterleaving, to output the codeword; and a decoder configured to decode the codeword, wherein the bit deinterleaver performs the deinterleaving by reading from a predetermined position in at least one of the plurality of columns in a column direction.

The bit deinterleaver may perform the deinterleaving by using information about the predetermined position in the at least one of the columns which is received from a transmitting apparatus of the signal.

According to another aspect of the exemplary embodiments, there is provided a receiving method at a receiving apparatus. The transmitting method may include: demodulating a signal to generate a value corresponding to a codeword; perform deinterleaving by writing the value corresponding to the codeword in a plurality of rows and reading from a plurality of columns of the plurality of rows to output the codeword; and decoding the codeword, wherein the reading is performed by reading from a predetermined position in at least one of the plurality of columns in a column direction.

Deinterleaving may be performed by using information about the predetermined position in the at least one of the columns which is received from a transmitting apparatus of the signal

BRIEF DESCRIPTION OF THE DRAWINGS

The above and/or other aspects will be more apparent by describing certain exemplary embodiments with reference to the accompanying drawings, in which.

DETAILED DESCRIPTION OF THE EXEMPLARY EMBODIMENTS

Figure 1:
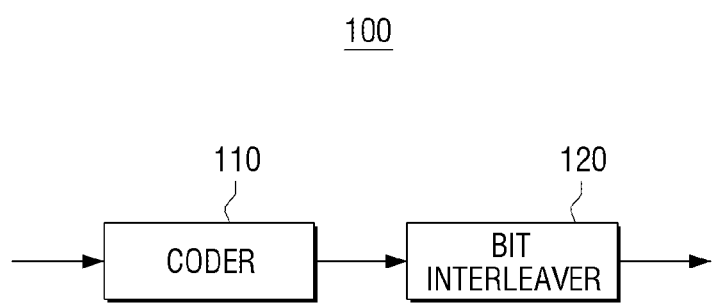
FIG. 1 is a block diagram illustrating a structure of a transmitting apparatus according to an exemplary embodiment.

Exemplary embodiments are described in greater detail with reference to the accompanying drawings.

In the following description, the same drawing reference numerals are used for the same elements even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the exemplary embodiments with unnecessary detail.

FIG. 1 is a block diagram illustrating a structure of a transmitting apparatus 100 according to an exemplary embodiment. Referring to FIG. 1, the transmitting apparatus 100 includes an encoder 110 and a bit interleaver 120.

The encoder 110 performs low-density parity-check code (LDPC) encoding on data. In detail, the encoder 110 may use input data as information bits to generate parity bits of the information bits and output an LDPC codeword including the information bits and the parity bits. A code length of the LDPC codeword may be 64800 or 16200. In other words, the LDPC codeword may include 64800 bits or 16200 bits.

Figure 2A:
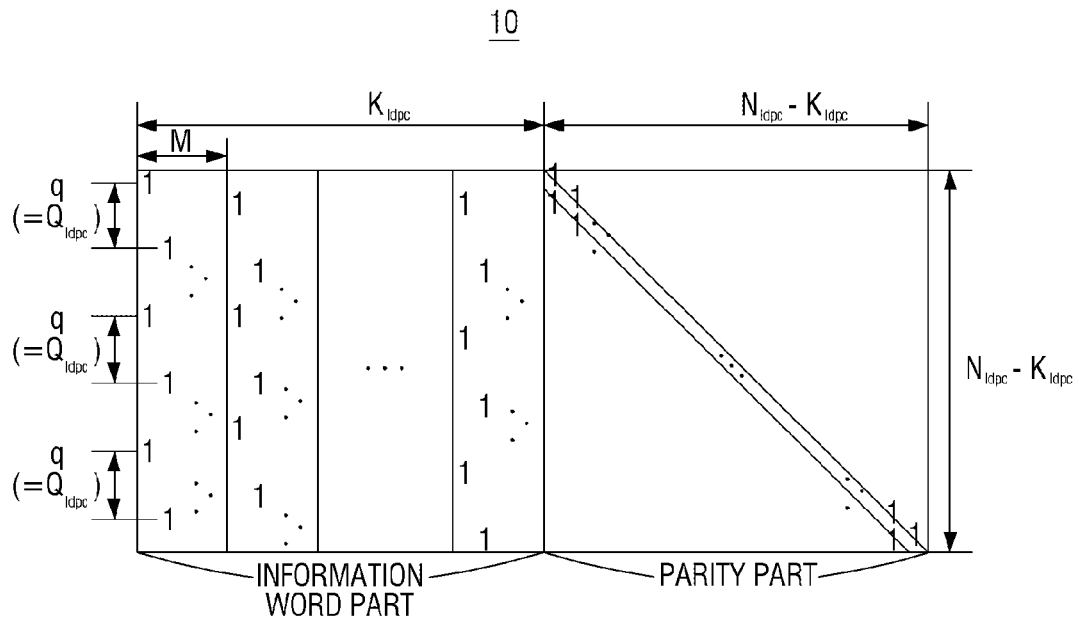
FIGS. 2A to 3B are views illustrating a parity check matrix according to exemplary embodiments.
Figure 2B:
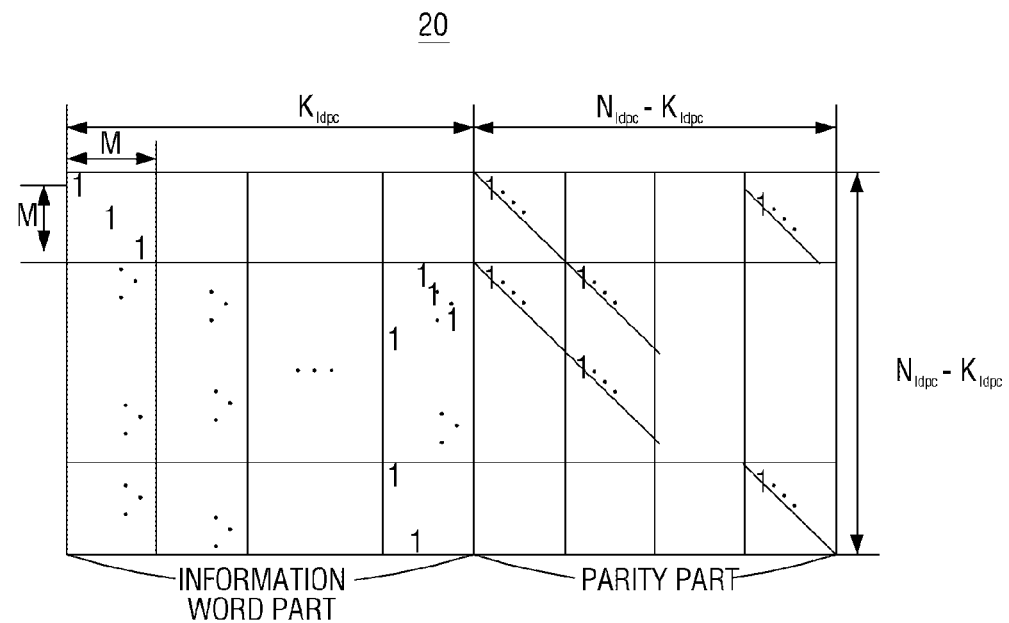

The encoder 110 may use a parity check matrix as shown in FIGS. 2A and 2B.

As shown in FIGS. 2A and 2B, a parity check matrix includes an information part having 0 and 1 as elements and a parity part.

Referring to FIG. 2A, in a parity check matrix 10, $N_{ldpc}$ denotes a length of an LDPC codeword, $K_{ldpc}$ denotes a length of information bits, and $N_{parity}=N_{ldpc}-K_{ldpc}$ denotes a length of parity bits. Also, M and $Q_{ldpc}$ are determined to establish $q=Q_{ldpc}=(N_{ldpc}-K_{ldpc})/M$. Here, M and $Q_{ldpc}$ may have various values according to a coding rate and the length of the LDPC codeword(e.g. M=360).

In the parity check matrix 10, a part corresponding to the parity part, i.e., a structure from a $K_{ldpc}^{th}$ column to an $(N_{ldpc}-1)^{th}$ column, has a dual diagonal shape. Therefore, a degree distribution of a column corresponding to the parity part has all a degree 2 except a last column having a degree 1.

In the parity check matrix 10, a part corresponding to the information part, i.e., a structure from a 0th column to the $(N_{ldpc}-1)^{th}$ column, is constituted according to the following rules.

<Rule 1>: $K_{ldpc}$ columns corresponding to the information part in the parity check matrix 10 are classified into a plurality of groups each of which has M columns, thereby to generate a total of $K_{ldpc}/M$ column groups. Each column may be constituted according to Rule 2 below.

<Rule 2>: A position of 1 in a first column of an $i^{th}$ (i=0, 1, 2, . . . , $K_{ldpc}/M-1$) column group is determined. Here, when a degree of the first column of the $i^{th}$ column group is $D_i$, and a position of each row having 1 is $R_{i,0}^{(0)}R_{i,0}^{(1)} \ldots R_{i,0}^{(D_i-1)}$, a position $R_{i,j}^{(k)}$ of a row having 1 in a $j^{th}$ (j=1, 2, . . . , M-1) column of the $i^{th}$ column group may be defined as in Equation 1 below:

$$R_{i,j}^{(k)}=R_{i,(j-1)}^{k}+Q_{ldpc} \bmod(N_{ldpc}-K_{ldpc}) \qquad (1),$$

where k=0, 1, 2, . . . , $D_i-1$, i=0, 1, 2, . . . , $K_{ldpc}/M-1$, and j=1, 2, . . . , M-1.

Equation 1 may be expressed as Equation 2 below:

$$R_{i,j}^{(k)}=\{R_{i,0}^{k}+(j \bmod M) \times Q_{ldpc}\} \bmod(N_{ldpc}-K_{ldpc}) \qquad (2),$$

where k=0, 1, 2, . . . , $D_i-1$, i=0, 1, 2, . . . , $K_{ldpc}/M-1$, and j=1, 2, . . . , M-1.

In Equations 1 and 2, $R_{i,j}^{(k)}$ denotes an index of a row having $k^{th}$ weight-1 in a $j^{th}$ column of an $i^{th}$ column group, $N_{ldpc}$ denotes a length of the LDPC codeword, $K_{ldpc}$ denotes a length of an information word, $D_i$ denotes a degree of columns belonging to the $i^{th}$ column group, and M denotes the number of columns belonging to one column group.

According to these rules, the degrees of columns belonging to the $i^{th}$ column group are all the same $D_i$.

According to Equation 1 or 2, when $R_{i,j}^{(k)}$ is known, an index of a column having $k^{th}$ weight-1 of the $i^{th}$ column group may be known. Therefore, when an index value of a column having $k^{th}$ weight-1 in a first column of each column group is stored, positions of a row and a column having weight-1 may be checked in the parity check matrix 10 (i.e., an information word part of the parity check matrix 10) having the structure shown in FIG. 2A.

The parity check matrix 10 is a parity check matrix that is used in LDPC encoding used in the DVB-T2 that is one of European digital broadcasting standards.

When positions of columns and rows of the parity check matrix 10 are changed by permutations, a parity check matrix 20 as shown in FIG. 2B may be generated.

In detail, when columns and rows of the parity check matrix 10 of FIG. 2A are permutated by Equation 3 (row permutations) and Equation 4 (column permutations) as shown below, the parity check matrix 20 of FIG. 2B may be acquired.

$$Q_{ldpc} \times i+j \Rightarrow M \times j+i (0 \leq i < M, 0 \leq j < Q_{ldpc}) \quad (3)$$

$$K_{ldpc}+Q_{ldpc} \times k+1 \Rightarrow K_{ldpc}+M \times l+k (0 \leq k < M, 0 \leq l < Q_{ldpc}) \quad (4),$$

Here, the row permutations mean that orders of indexes of rows of the parity check matrix 10 are changed by using Equation 3. Also, the column permutations mean that orders of indexes of columns of the parity check matrix 10 are changed by using Equation 4.

A method of performing permutations based on Equations 3 and 4 will now be described. The row permutations and the column permutations use the same principle, and thus, only the row permutations will be exemplarily described.

In the row permutations, i, j of an $X^{th}$ column satisfying $X=Q_{ldpc} \times i+j$ is calculated, and then are substituted in $M \times j+i$ to calculate a column in which the $X^{th}$ column is permutated. For example, since i, j of a seventh column satisfying $7=2 \times i+j$ are respectively 3 and 1, the seventh column is permutated to $13^{th}$ column because $10 \times 1+3=13$.

If the row permutations and the column permutations are performed as described above, the parity check matrix 10 of FIG. 2A may be expressed as the parity check matrix 20 of FIG. 2B.

If LDPC encoding is performed by using the parity check matrix 20 generated according to the above-described method, a parity bit that is arranged at a preset interval among parity bits generated by the parity check matrix 10 may be consecutively arranged in a group. Here, the preset interval may be $Q_{ldpc}$.

Figure 3A:
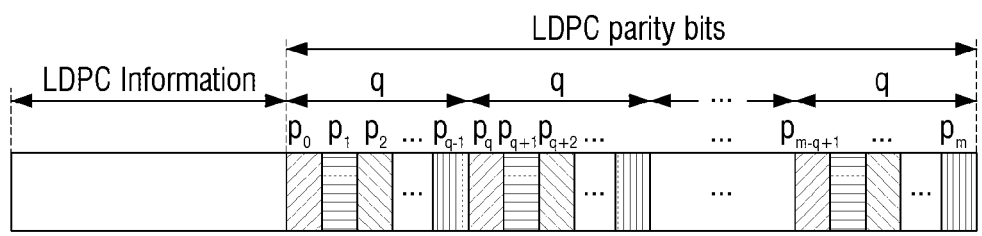
Figure 3B:
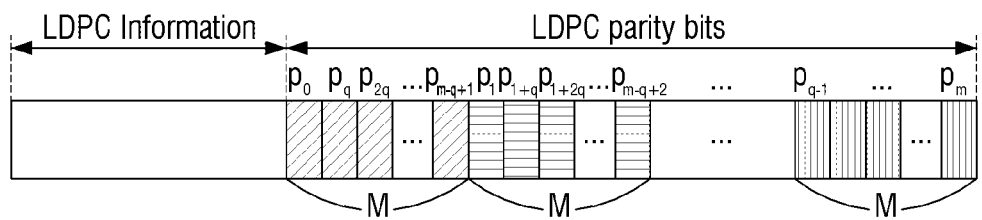

For example, the LDPC codeword generated by using the parity check matrix 10 may have a form as shown in FIG. 3A. Here, $m=N_{ldpc}-K_{ldpc}-1$. If LDPC encoding is performed by using the parity check matrix 20, a LDPC codeword as shown in FIG. 3B may be generated. As shown in FIG. 3B, M parity bits of FIG. 3A that are arranged at an interval $Q_{ldpc}$ (i.e., interval q) may be consecutively arranged to form one group, and each group may be arranged in a group unit.

If parity bits generated by performing encoding based on FIG. 2A are interleaved by using Equation 5 as shown below, the same parity bits as parity bits generated by performing encoding based on the parity check matrix 20 of FIG. 2B may be acquired.

$$P_{k_{ldpc}+Q_{ldpc} \times k+l} = P_{k_{ldpc}+M \times l+k} \quad (5),$$

where $0 \leq k < M$, $0 \leq l < Q_{ldpc}$, P denotes a parity bit, and indexes of parity bits may be changed to satisfy $K_{ldpc}+Q_{ldpc} \times k+l=K_{ldpc}+M \times l+k$ through parity interleaving in order to rearrange orders of the parity bits.

The encoder 110 may perform encoding to generate LDPC codeword which satisfies $H \sim C^T=0$. Here, H is a parity check matrix, and C is an LDPC codeword.

For example, the encoder 110 may receive information bits including $K_{ldpc}$ bits to generate an LDPC codeword including $N_{ldpc}$ bits. In other words, the encoder 110 may perform LDPC coding on information bits ($i_0, i_1, i_2, \ldots, i_{k_{ldpc}-1}$) including $K_{ldpc}$ bits to generate an LDPC codeword ($i_0, i_1, i_2, \ldots, i_{k_{ldpc}-1}, p_0, p_1, p_2, \ldots, p_{N_{ldpc}-k_{ldpc}-1}$). Here, $p_0, p_1, p_2, \ldots,$ and $p_{N_{ldpc}-k_{ldpc}-1}$ refer to parity bits.

The encoder 110 may also perform Bose, Chaudhuri, Hocquenghem (BCH) encoding as well as the LDPC encoding. The encoder 110 may perform BCH encoding on input data to add BCH parity bits and LDPC-coding on the data to which the BCH parity bits are added to an information word to generate an LDPC codeword.

The bit interleaver 120 interleaves data (i.e., information bits) and parity bits generated by the LDPC encoding by using a plurality of columns.

In detail, the bit interleaver 120 may write the LDPC codeword output from the encoder 110 in a plurality of columns in a column direction. Here, the bit interleaver 120 may write the LDPC codeword from an arbitrary row of each column in the column direction. If the LDPC codeword is written in a last row of one column, the bit interleaver 120 may write the LDPC codeword from a first row of the column to write the LDPC codeword in all rows of the column.

The bit interleaver 120 may repeat this operation to write the LDPC codeword in a plurality of columns in the column direction and read the LDPC codeword, which is written in the column direction, in a row direction to perform interleaving. Here, data and parity bits constituting the LDPC codeword may be written and read in a bit unit.

Here, the bit interleaver 120 may write the data and the parity bits in the column direction to arrange parity bits included in a predetermined group in predetermined positions of the plurality of columns for the interleaving.

In detail, the bit interleaver 120 may write the data and the parity bits in the plurality of columns to arrange parity bits arranged at a preset interval (as shown in FIG. 3A) in first rows of the plurality of columns. For this, the bit interleaver 120 may adjust a start position in which an information bit of the data and/or a parity bit is first written in at least some columns.

Here, the preset interval may be a fixed bit interval, for example, may be $Q_{ldpc}$. The bit interleaver 120 may classify parity bits arranged at a preset bit interval into the same parity group and write parity bits belonging to one of a plurality of parity groups in first rows of a plurality of columns.

For example, an LDPC codeword of 64800 bits may be generated by the LDPC encoding, $Q_{ldpc}=90$, and R (coding rate)=½. The bit interleaver 120 may classify parity bits among 32400 parity bits arranged at a 90-bit interval into the same parity group.

In detail, the bit interleaver 120 may classify parity bits among parity bits $p_0, p_1, p_2, \ldots, p_{32397}, p_{32398}$ and $p_{32399}$ arranged at a 90-bit interval into the same parity group. In other words, the bit interleaver 120 may classify parity bits into parity groups such as "$p_0, p_{90}, \ldots, p_{32310}$", "$p_1, p_{91}, \ldots, p_{32311}$", "$p_2, p_{92}, \ldots, p_{32312}$", and "$p_{89}, p_{179}, \ldots, p_{32399}$". Parity bits belonging to a $j^{th}$ parity group may be expressed as $p_j=\{p_k / k \mod Q_{ldpc}=j, 0 \leq k < N_{ldpc}-K_{ldpc}\}(0 \leq j < Q_{ldpc})$.

However, this is only an example, $Q_{ldpc}$ may be changed according to a coding rate of the encoder 110 and a length of an LDPC codeword. Therefore, the number of parity bits belonging to one parity group may be changed.

A detailed method of writing a parity bit through the bit interleaver 120 will now be described with reference to FIGS. 4 and 5. In particular, the encoder 110 may perform LDPC encoding by using the parity check matrix 10 as shown in FIG. 2A.

Figure 4:
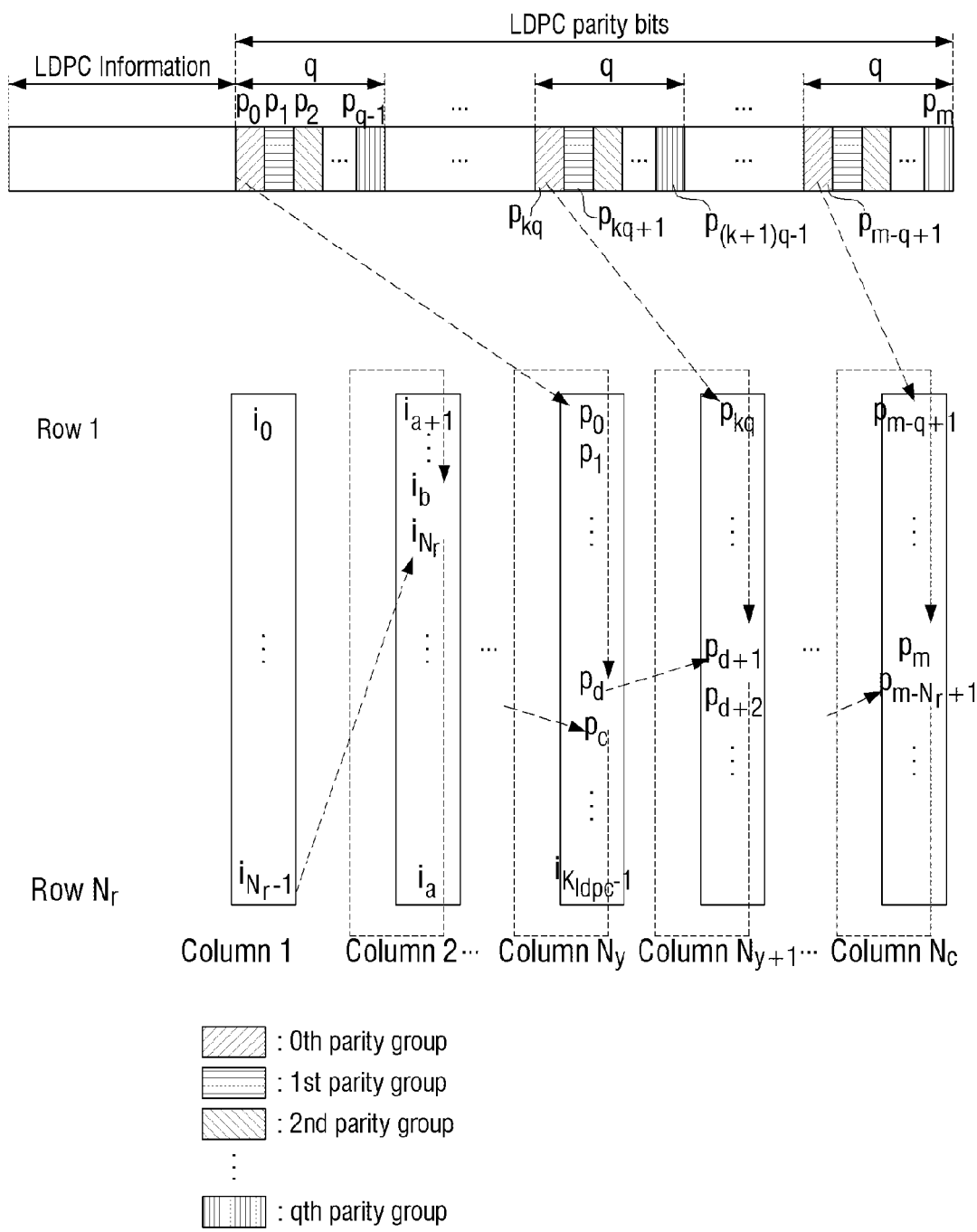
FIGS. 4 to 9 are views illustrating a method of performing interleaving according to an exemplary embodiment.
Figure 5:
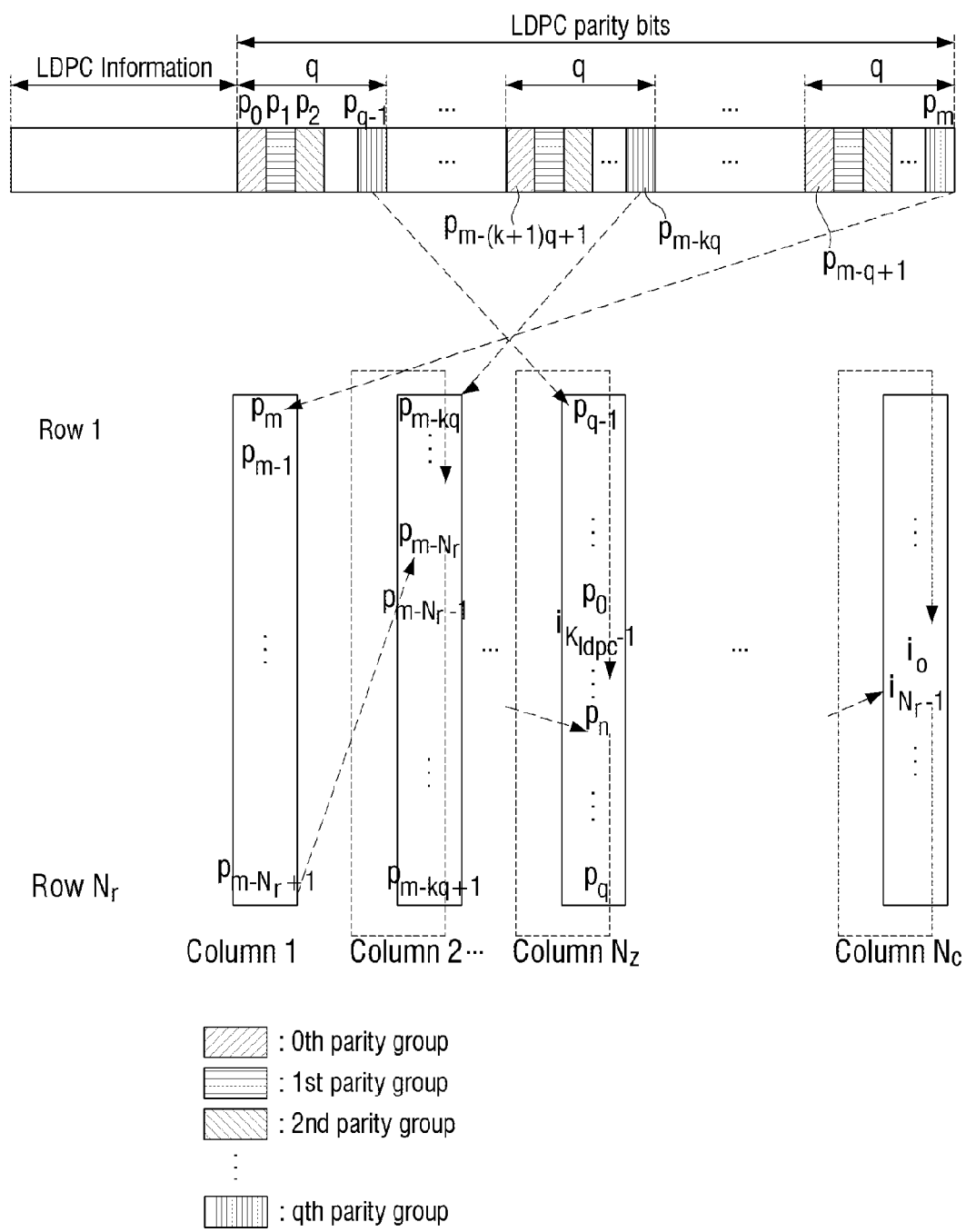

As shown in FIGS. 4 and 5, the bit interleaver 120 may include $N_c$ columns having $N_r$ rows.

Here, the number of rows and the number of columns may have various values according to a modulation method and a length of an LDPC codeword. For example, if the LDPC codeword including 64800 bits is modulated by a 16-QAM method, the bit interleaver 120 may include eight columns having 8100 rows.

The bit interleaver 120 may first write data out of the data and parity bits or may first write the parity bits to arrange parity bits included in a predetermined group in a first row of each column. Hereinafter, each case will be described.

A method of writing data and parity bits in the order of the data and the parity bits will now be described.

The bit interleaver 120 may sequentially write data in a plurality of columns, and then, may sequentially write parity bits in the plurality of columns. This will now be described in more detail with reference to FIG. 4.

The bit interleaver 120 may sequentially write information bits of bits constituting an LDPC codeword in each column.

In detail, the bit interleaver 120 may write information bits $i_0, i_1, \ldots, i_{N_r-2}$, and $i_{N_r-1}$ from a first row to an $N_r^{th}$ row of the first column to fill all rows of the first column with information bits.

The bit interleaver 120 may write an information bit $i_{N_r}$ in an arbitrary row of a second column, i.e., in an $x^{th}$ row, and sequentially write next information bits from an $x+1^{th}$ row to an $N_r^{th}$ row in a column direction. In other words, the bit interleaver 120 may write information bits $i_{N_r+1}, i_{N_r+2}, \ldots, i_{a-1}$, and $i_a$ (where $a=2N_r-x$) from the $x+1^{th}$ row to the $N_r^{th}$ row.

When information bits are written in a last row in the second column, the bit interleaver 120 may sequentially write next information bits from a first row of the second column to fill all rows of the second column with information bits. In other words, the bit interleaver 120 may write information bits $i_{a+1}, i_{a+2}, \ldots, i_{b-1}$, and $i_b$ (wherein, $b=2N_r-1$) from the first row of the second column to an $x-1^{th}$ row of the second column. Therefore, the bit interleaver 120 may write information bits in all rows of the second column.

When information bits are written in all rows of one column as described above, the bit interleaver 120 may write information bits from an arbitrary row of a next column to a last row of this column in a column direction, and then write information bits from a first row of this column in the column direction, thereby to fill each column with information bits.

When information bits are completely written, the bit interleaver 120 may sequentially write parity bits in each column.

Here, the bit interleaver 120 may determine a position of an information bit that is first written in a column in which a last information bit is written, to arrange the last information bit in a last row of the column in which the last information bit is written, and then sequentially write information bits from a row of the determined position. Therefore, the last information bit may be written in the last row of the corresponding column, and the first parity bit of the LDPC codeword may be written in a first row of the corresponding column.

For example, last information bit $i_{K_{ldpc}-1}$ may be written in a column $N_y$. The bit interleaver 120 may determine a position $t_c$ of a row in which an information bit $i_c$ to be first written in column $N_y$ is to be written, through Equation 6 below, so that a last information bit $i_{K_{ldpc}-1}$ is written in a last row of the column $N_y$ and write the information bit $i_c$ in the determined row:

$$t_c = N_{parity} - \left\lfloor \frac{N_{parity}}{N_c} \right\rfloor \times N_r, \qquad (6)$$

where $N_{parity}$ denotes the number of parity bits, $N_{ldpc}$ denotes the number of LDPC codeword bits, $N_c$ denotes the number of columns, $N_r$ denotes the number of rows, and $\lfloor \ \rfloor$ denotes a floor operator and $\lfloor x \rfloor$ means maximum integer smaller than x.

However, the above-described method is only an example, and position $t_c$ may be determined by using another method which does not use Equation 6.

Therefore, when the information bit $i_c$ is written in the determined row, and the other information bits are sequentially written in a column direction, the last information bit $i_{K_{ldpc}-1}$ may be written in the last row of the column $N_y$, and a first parity bit $p_0$ may be written in a first row of the column $N_y$.

According to the above-described method, the bit interleaver 120 may write a first parity bit in a first row of a column.

The bit interleaver 120 may sequentially write parity bits in the column direction to fill all rows of a corresponding column with the parity bits.

The bit interleaver 120 may write a parity bit, belonging to a parity group to which a first parity bit belongs, in a first row of a next column (i.e., a column next to a column in which a first parity bit is written).

In detail, the bit interleaver 120 may determine a position of a parity bit that is first written in a corresponding column to write a parity bit, belonging to a parity group to which a first parity bit belongs, in a first row of a next column, and then may sequentially write the parity bit in a row of the determined position. Therefore, a parity bit belonging to a parity group to which a first parity bit belongs may be written in a first row of a next column.

For example, the parity bit $p_0$ may be written in a first row of the column $N_y$, parity bits $p_1, p_2, \ldots$ may be sequentially written from a next row, and parity bit $p_d$ may be lastly written in the column $N_y$. The bit interleaver 120 may determine the position $t_c$ of a row in which a parity bit $p_{d+1}$ to be first written in the column $N_{y+1}$ is to be written, through Equation 7 as shown below, so that one of parity bits belonging to a parity group to which the parity bit $p_0$ belongs, i.e., parity bit $p_{kq}$ which is arranged separately from the parity bit $p_0$ by an integer multiple of q $(=Q_{ldpc})$ (i.e., kq), is written in a first row of the column $N_{y+1}$.

$$t_c = d + N_r - \left\lceil \frac{d+1}{q} \right\rceil \times q, \qquad (7)$$

where $N_r$ denotes the number of rows, and d denotes an index of a parity bit that is first written in a column next to a column in which a first parity bit is written. Also, $\lceil \ \rceil$ denotes a floor operator and $\lceil x \rceil$ means minimum integer larger than x.

However, the above-described method is only an example, and the position $t_c$ may be determined by using another method which does not use Equation 7.

The bit interleaver 120 may write the parity bit $p_{d+1}$ in the determined position of the row and sequentially write parity bits $p_{d+2}, p_{d+3}, \ldots$ from a next row in the column direction. Therefore, the parity bit $p_{kq}$ belonging to the parity group, to which the parity bit $p_0$ written in the first row of the column $N_y$ belongs, may be written in the first row of the column $N_{y+1}$.

The bit interleaver 120 may repeatedly perform the above-described method to write parity bits belonging to the same parity group in the first row of each column.

For example, when the parity bit $p_0$ is written in the first row of a column, parity bits belonging to the parity group to which the parity bit $p_0$ belongs, i.e., the parity bits $p_{kq}$ arranged separately from the parity bit $p_0$ by an integer multiple (i.e., kq), may be written in a first row of each column According to a position in each column where a parity bit is first written, parity bits belonging to the parity group of the parity bit $p_0$ and to be written in the first row of each column may be variously changed.

For example, as shown in FIG. 4, the bit interleaver 120 may determine a position of a row in which the parity bit $p_{d+1}$ is to be written as an $x^{th}$ row to write a parity bit $p_{2q}$, among parity bits belonging to the parity group to which the parity bit $p_0$ belongs, in the first row of the column $N_{y+1}$. However, the bit interleaver 120 may determine the position of the row in which the parity bit $p_{d+1}$ is to be written as an x-2q$^{th}$ row to write $p_{4q}$, among the parity bits belonging to the parity group to which the parity bit $p_0$ belongs, in the first row of the column $N_{y+1}$.

As described above, the bit interleaver 120 may variously determine a position of a parity bit to be first written in each column such that parity bits belonging to the parity group to which the parity bit $p_0$ belongs are written in the first row of each column.

Parity bit $p_{m-q+1}$ is written in a first row of a column $N_c$ in FIG. 4, but this is only an example. In other words, as described above, according to a position in the $N_c$ column where a parity bit $p_{m-Nr+1}$ is first written, a parity bit written in the first row of the $N_c$ column may be variously changed among parity bits belonging to the parity group to which the parity bit $p_0$ belongs.

A method of writing parity bits and data in this order will now be described.

The bit interleaver 120 may sequentially write parity bits in a plurality of columns in a reverse order, and then sequentially write data in the plurality of columns in a reverse order. This will now be described in more detail with reference to FIG. 5.

The bit interleaver 120 may sequentially write parity bits among bits constituting an LDPC codeword in each column. The bit interleaver 120 may write the parity bits in a reverse order.

In detail, the bit interleaver 120 may write $p_m$, $p_{m-1}, \ldots$, and $p_{m-N_r+1}$ from a first row to an $N_r^{th}$ row of a first column to fill all rows of the first column with parity bits.

The bit interleaver 120 may write a parity bit, belonging to a parity group to which the last parity bit of the LDPC codeword belongs, in the first row of a second column. Here, the last parity of the LDPC codeword is $p_m$ which is written in the first row of the first column.

In detail, the bit interleaver 120 may determine a position of a parity bit that is to be first written in the second column such that a parity bit, belonging to a parity group to which the last parity bit of the LDPC codeword belongs, is written in the first row of the second column, and then write the parity bit from a row of the determined position. Therefore, the parity bit belonging to the parity group to which the last parity bit of the LDPC codeword belongs, may be written in the first row of the second column.

For example, a parity bit $P_{m-N}$ may be first written in the second column. The bit interleaver 120 may determine a position $t_c$ of a row in which the parity bit $P_{m-N_r}$ is to be written in the second column, through Equation 8 as shown below, so that a parity bit $p_{m-kq}$ which is arranged separately from the parity bit $p_m$ by an integer multiple of q ($=Q_{ldpc}$) (i.e., kq) is written in the first row of the second column and write the parity bit $N_r$ in the determined row. Here, the integer k may be $$\left\lceil \frac{N_r}{q} \right\rceil.$$

$$t_c = \left\lceil \frac{N_r}{q} \right\rceil \times q - 2 \times N_r, \quad (8)$$

where $N_r$ may be the number of rows.

The bit interleaver 120 may write the parity bit $P_{m-N}$ in the position of the determined row and sequentially write parity bits $p_{m-N_r-1}$ and $p_{m-N_r-2}$ from a next row in a column direction.

Therefore, parity bit $p_{m-kq+1}$ may be written in a last row of the second column, and a parity bit $p_{m-kq}$ belonging to the parity group, to which the parity bit $p_m$ written in a first row of a first column belongs, may be written in the first row of the second column. Again, the integer k may be $$\left\lceil \frac{N_r}{q} \right\rceil.$$

As described above, the bit interleaver 120 may write a parity bit belonging to the parity group to which the last parity bit of the LDPC codeword belongs, in the first row of the second column.

The bit interleaver 120 may write subsequent parity bits in a reverse order to fill all rows of the second column with parity bits. In other words, the bit interleaver 120 may sequentially write parity bits $p_{m-kq-1}, p_{m-kq-2}, \ldots$ from a second row of the second column to fill all rows of the second column with parity bits.

The bit interleaver 120 may repeatedly perform the above-described method to write parity bits belonging to the parity group to which the last parity bit of the LDPC codeword belongs, in a first row of each column. For example, if the parity bit $p_m$ is written in a first row of the first column, parity bits belonging to the parity group to which the parity bit $p_m$ belongs, i.e., parity bits $p_{m-kq}$ separate from the parity bit $p_m$ by an integer multiple of q (i.e., kq), may be written in a first row of each column.

According to a position in each column where a parity bit is first written, a parity bit written in a first row of each column, except the first column, may be variously changed among parity bits belonging to the parity group to which the parity bit $p_m$ belongs.

For example, referring to FIG. 5, the bit interleaver 120 may determine a position of a row in which the parity bit $p_{m-N_r}$ is to be written as an $x^{th}$ row to write a parity bit $p_{m-2q}$ of parity bits belonging to the parity group, to which the parity bit $p_m$ belongs, in a first row of a second column. However, the bit interleaver 120 may determine the position of the row in which the parity bit $p_{m-N_r}$ is to be written as x-2q$^{th}$ row to write a parity bit $p_{m-4q}$ of parity bits belonging to the parity group, to which the parity bit $p_m$ belongs, in the first row of the second column.

As described above, the bit interleaver 120 may variously determine a position of a parity bit to be first written in each column such that parity bits belonging to the parity group to which the parity bit $p_m$ belongs are written in a first row of each column.

If all parity bits are written, the bit interleaver 120 may write information bits in each column. Even in this case, information bits may be written in each column in a reverse order.

Here, the bit interleaver 120 may determine a position of a parity bit that is first written in a column in which the first parity bit of the LDPC codeword is to be written such that a parity bit belonging to the parity group to which the last parity of the LDPC codeword bit belongs is written in the first row of this column.

The bit interleaver 120 may write a parity bit from a row of the determined position so that a parity bit belonging to the parity group to which the last bit of the LDPC codeword belongs is written in the first row of the corresponding column.

In other words, when the first parity bit $p_0$ of the LDPC codeword is to be written in a column $N_z$, the bit interleaver 120 may determine a position $t_c$ of a row in which a parity bit $p_n$ is to be first written in the column $N_z$, through Equation 9 below, so that a parity bit $p_{q-1}$ belonging to a parity group to which the last parity bit $p_m$ belongs is written in a first row of the column $N_z$.

$$t_c = K_{ldpc} - \left\lfloor \frac{K_{ldpc}}{N_r} \right\rfloor \times N_r. \quad (9)$$

where $N_r$ denotes the number of rows.

The bit interleaver 120 may write the parity bit $p_n$ in the position of the determined row, and then sequentially write parity bits $p_{n-1}$, $p_{n-2}$, ... in a column direction. Therefore, a parity bit $p_q$ may be written in a last row of the column $N_z$, and a parity bit $p_{q-1}$ belonging to the parity group to which the last parity bit $p_m$ belongs may be written in a first row of this column.

In the above-described exemplary embodiment, the parity bit $p_{q-1}$ is written in a first row of the column $N_z$, i.e., in a first row of a column in which a parity bit and an information bit are written together, but this is only an example. In other words, as described above, according to a position in the column $N_z$, column in which the parity bit $p_n$ is first written, a parity bit written in the first row of the column $N_z$ may be variously changed among parity bits belonging to the parity group to which the last parity bit $p_m$ of the LDPC codeword belongs.

The bit interleaver 120 may sequentially write parity bits $p_{q-2}$, $p_{q-3}$, ..., and $p_0$ from a second row of the column $N_z$, to write all remaining parity bits of the LDPC codeword.

When all parity bits of the LDPC codeword are written, the bit interleaver 120 may write information bits. Even in this case, the information bits may be written in a reverse order.

In other words, the bit interleaver 120 may sequentially write information bits $i_{k_{ldpc}-1}$, $i_{k_{ldpc}-2}$, ... from a row in which the first parity bit $p_0$ is written to fill all rows of the $N_z$ column.

The bit interleaver 120 may write information bits in the remaining columns to write all information bits. In this case, a position of a row in each column in which an information bit is first written may be arbitrarily determined.

As described above, according to various exemplary embodiments, parity bits belonging to the same parity group may be positioned in the same row of each column. Here, the parity bits belonging to the same parity group may be parity bits that are arranged at a preset interval, for example, a $Q_{ldpc}$ (=q) interval, and may be regarded as parity bits having low correlations.

Here, the low correlations mean that a path connected to the same check node is long when a receiving unit, which receives LDPC-encoded data, performs LDPC decoding by using a tanner graph, which means that parity bits less affect one another when performing LDPC decoding.

If bits are written in each column according to the methods described with reference to FIGS. 4 and 5, the bit interleaver 120 may read the bits written in each column in a row direction to perform interleaving. Here, since parity bits having low correlations are arranged in the same row, the parity bits may be sequentially output.

Here, bits output from the same row may constitute at least one modulation symbol. Each modulation symbol constitutes a cell to be mapped on an orthogonal frequency-division multiplexing (OFDM) frame in order to constitute an OFDM symbol. Therefore, parity bits having low correlations are included in the same modulation symbol to be mapped on the same OFDM symbol. Also, parity bits that are consecutively arranged before bit interleaving may be mapped on different OFDM symbols, and thus may be transmitted at a maximally distant time interval.

Therefore, although an OFDM symbol fades, parity bits included in the OFDM symbol have low correlations, and thus do not greatly affect LDPC decoding.

The bit interleaver 120 may classify rows arranged at a preset interval in a plurality of columns into a same row group and read bits written in each row group in a preset order. Here, the present interval may be the $Q_{ldpc}$ (=q).

In detail, the bit interleaver 120 may read bits respectively written in a plurality of rows of an arbitrary row group, and then read bits written in a plurality of rows of a row group which include parity bits having low correlations with parity bits included in the read row group.

Figure 6:
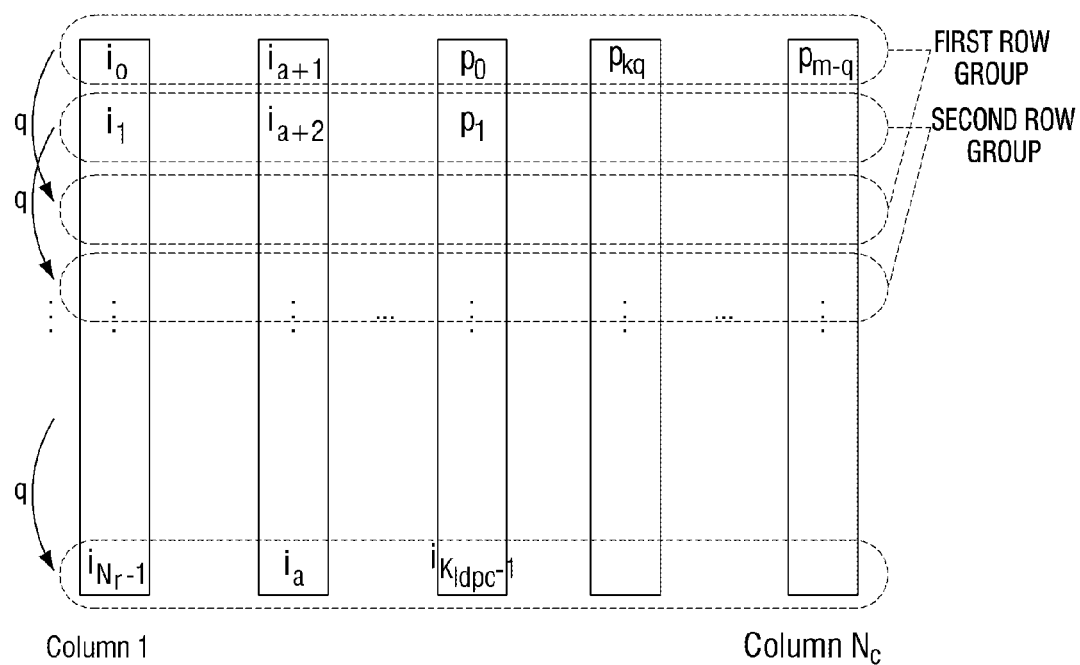

For example, as shown in FIG. 6, the bit interleaver 120 may classify a first row and rows separate from the first row by the interval $Q_{ldpc}$ into a first row group, a second row and rows separate from the second row by the interval $Q_{ldpc}$ into a second group, ..., and an $N_{th}$ row and rows separate from the $N_{th}$ row by the interval $Q_{ldpc}$ into an $N_{th}$ row group.

The bit interleaver 120 may sequentially read bits that are respectively written in a plurality of rows of the first row group including a parity $p_0$. If all bits included in the first row group are read, the bit interleaver 120 may determine a row group including a parity bit $p_1$ having the lowest correlation with a lastly read parity bit in the first row group among all parity bits or unread parity bits. Here, the parity bit $p_1$ may be a parity bit that is arranged between the parity bit $p_0$ and a parity bit $p_{k_q-1}$.

The bit interleaver 120 may sequentially read bits written in each row of the row group including the parity bit $p_1$.

The bit interleaver 120 may repeatedly perform the above-described method to read all bits written in the plurality of columns.

However, this is only an example, and the bit interleaver 120 may respectively allocate indexes to row groups and apply a bit-reverse order to each of the indexes to determine a row group including parity bits having the lowest correlation with parity bits included in a previously read row group.

If a reading operation is performed as described above, a possibility that parity bits partly having correlations will be mapped on the same OFDM is more lowered than when each row is sequentially read. Therefore, an LDPD decoding performance may be further improved.

As described with reference to FIGS. 4 through 6, if LDPC encoding is performed by the parity check matrix 10 of FIG. 2A, parity bits that are arranged at a preset interval are arranged in preset positions of a plurality of columns.

Figure 7:
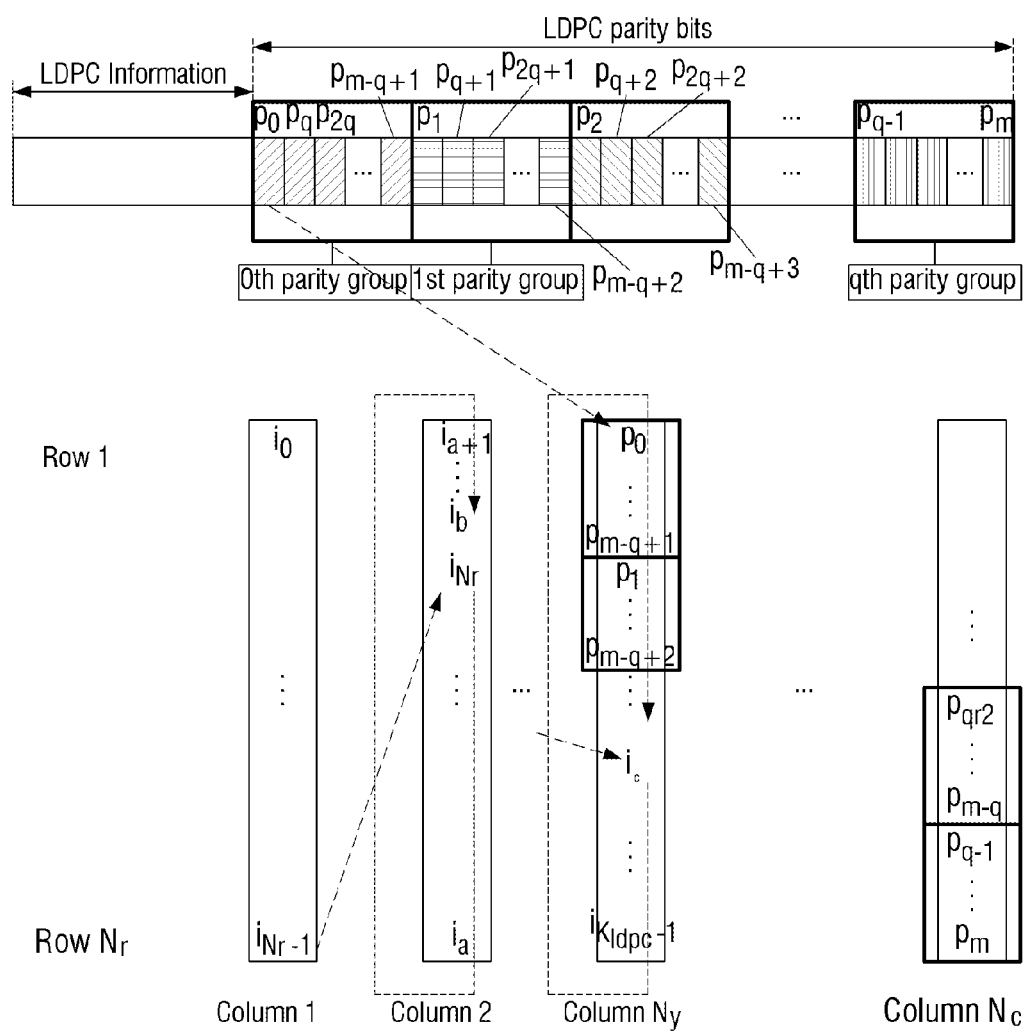

A method of performing LDPC encoding by using the parity check matrix 20 of FIG. 2B will now be described with reference to FIGS. 7 through 9.

An LDPC codeword generated based on the parity check matrix 20 of FIG. 2B, i.e., the LDPC codeword of FIG. 3B, is equal to a result of performing interleaving on parities of an LDPC codeword generated based on the parity check matrix 10 of FIG. 2A, i.e., on parities of the LDPC codeword of FIG. 3A, by using Equation 5. Therefore, the bit interleaver 120 may perform parity-interleaving on the LDPC generated based on the parity check matrix 10 of FIG. 2A to generate the LDPC codeword of FIG. 3B.

The bit interleaver 120 may write data (i.e., information bits) and parity bits in a column direction to arrange parity bits of a predetermined group in predetermined positions of a plurality of columns in order to perform interleaving.

Here, the predetermined group may be first one of groups each of which includes M consecutive parity bits of an LDPC codeword. For example, referring to FIG. 3A, the predetermined group may be a first group, i.e., a parity group that includes parity bits $p_0$, $p_q$, ..., and $p_{m-q+1}$.

Here, the bit interleaver 120 may write data and parity bits in a plurality of columns to arrange a first parity bit among parity bits of the predetermined group in a first row of a column. For this, the bit interleaver 120 may adjust a start position in at least some columns in which an information bit of data or a parity bits is first written.

Alternatively, the predetermined group may be a last group of the groups each of which includes the M consecutive parity bits of the LDPC codeword. For example, referring to FIG. 3B, the predetermined group may be a last group, i.e., a parity group that includes parity bits $p_0$, $p_{2q-1}$, ..., and $p_m$.

Here, the bit interleaver 120 may write data and parity bits in a plurality of columns to arrange a last one of the parity bits of the predetermined group in a first row of a column. For this, the bit interleaver 120 may adjust a start position of at least some columns in which an information bit of the data and/or a parity bit is first written.

This will now be described in more detail with reference to FIGS. 7 and 8.

The bit interleaver 120 may first write data or may first write parity bits to arrange a parity bit of a predetermined group in a first row of each column. Each case will now be described.

A method of writing data and parity bits in this order will now be described.

The bit interleaver 120 may sequentially write data in a plurality of columns, and then sequentially write parity bits in the plurality of columns. This will now be described in more detail with reference to FIG. 7.

The bit interleaver 120 may sequentially write information bits of bits constituting an LDPC codeword in each column. A method of writing the information bits is the same as that described with reference to FIG. 4, and thus a detailed description thereof is omitted.

If the information bits are completely written, the bit interleaver 120 may sequentially write parity bits in each column.

Here, the bit interleaver 120 may write first one of parity bits included in a first group in a first row of a column in which the last information bit is written.

In detail, the bit interleaver 120 may determine a position of an information bit to be first written in a corresponding column to write the last information bit in a last row of the corresponding column and write information bits from a row of the determined position. Therefore, the bit interleaver 120 may write the last information bit in the last row of the corresponding column and write first one of parity bits of a first group in a first row of the corresponding column.

For example, the bit interleaver 120 may write a last information bit $i_{k_{ldpc}-1}$ in a column $N_y$. In this case, the bit interleaver 120 may determine a row position $t_c$ of an information bit $i_c$ that is to be first written in the column $N_y$ to arrange the last information bit $i_{k_{ldpc}-1}$ in a last row of the column $N_y$. Here, the bit interleaver 120 may determine the row position $t_c$ using Equation 6 above.

The bit interleaver 120 may write the information bit $i_c$ in a row of a determined position and sequentially write information bits $i_{c+1}$, $i_{c+2}$, ... from a next row. Therefore, the last information bit $i_{k_{ldpc}-1}$ may be written in a last row of the column $N_y$, and a first parity bit $p_0$ of parity bits of a first group may be written in a first row of the $N_y$ column.

The bit interleaver 120 may sequentially write parity bits of each group.

In detail, the bit interleaver 120 may write the first parity bit $p_0$ of the parity bits of the first group in a first row, and then sequentially write parity bits $p_q$, $p_{2q}$, ... and $p_{m-q+1}$ belonging to the same group to which the parity bit $p_0$ belongs.

Therefore, if all of parity bits belong to a group are written, the bit interleaver 120 may write parity bits belonging to a next group. In other words, if all of parity bits of the first group are written, the bit interleaver 120 may sequentially write parity bits $p_1$, $p_{q+1}$, $p_{2q+1}$, ..., and $p_{m-q+2}$ of a second group in a column direction.

Therefore, the bit interleaver 120 may write parity bits of each group in a column. Here, when bits are written in all rows of one column, the bit interleaver 120 may write parity bits from a first row of a next column in a column direction.

According to the above-described method, the bit interleaver 120 may write first one of parity bits of the first group in the first row of a column and sequentially write the other parity bits in a plurality of columns by groups.

A method of writing parity bits and data in this order will now be described.

The bit interleaver 120 may sequentially write parity bits in a plurality of columns in a reverse order, and then sequentially write data in a plurality of columns in a reverse order. This will be described in more detail with reference to FIG. 8.

The bit interleaver 120 may sequentially write parity bits of bits constituting an LDPC codeword in each column. In this case, the bit interleaver 120 may write parity bits in a reverse order.

Here, the bit interleaver 120 may write last one of parity bits of a last group in a first row of a first column. The bit interleaver 120 may write the other parity bits of the last group in the first column in a reverse order to write all of parity bits of the last group.

In other words, the bit interleaver 120 may sequentially write parity bits $p_m$, $p_{m-q}$, ..., and $p_{q-1}$ from the first row of the first column to write all of the parity bits of the last group.

Therefore, if all of the parity bits of the last group are written, the bit interleaver 120 may write parity bits of a next group. In other words, if all of the parity bits of the last group are written, the bit interleaver 120 may sequentially write parity bits $p_{m-1}$, $p_{m-q-1}$, ..., $p_{q-2}$ of a group right before the last group, in a column direction.

Therefore, the bit interleaver 120 may write parity bits in a column by groups. Here, if bits are written in all rows of one column, the bit interleaver 120 may write parity bits from a first row of a next column in a column direction.

According to the above-described method, the bit interleaver 120 may write last one of parity bits of a last group in a first row of a first column and write the other parity bits in a plurality of columns according to groups.

If all of parity bits are written, the bit interleaver 120 may write information bits in each column. Even in this case, the information bits may be written in each column in a reverse order.

Figure 8:
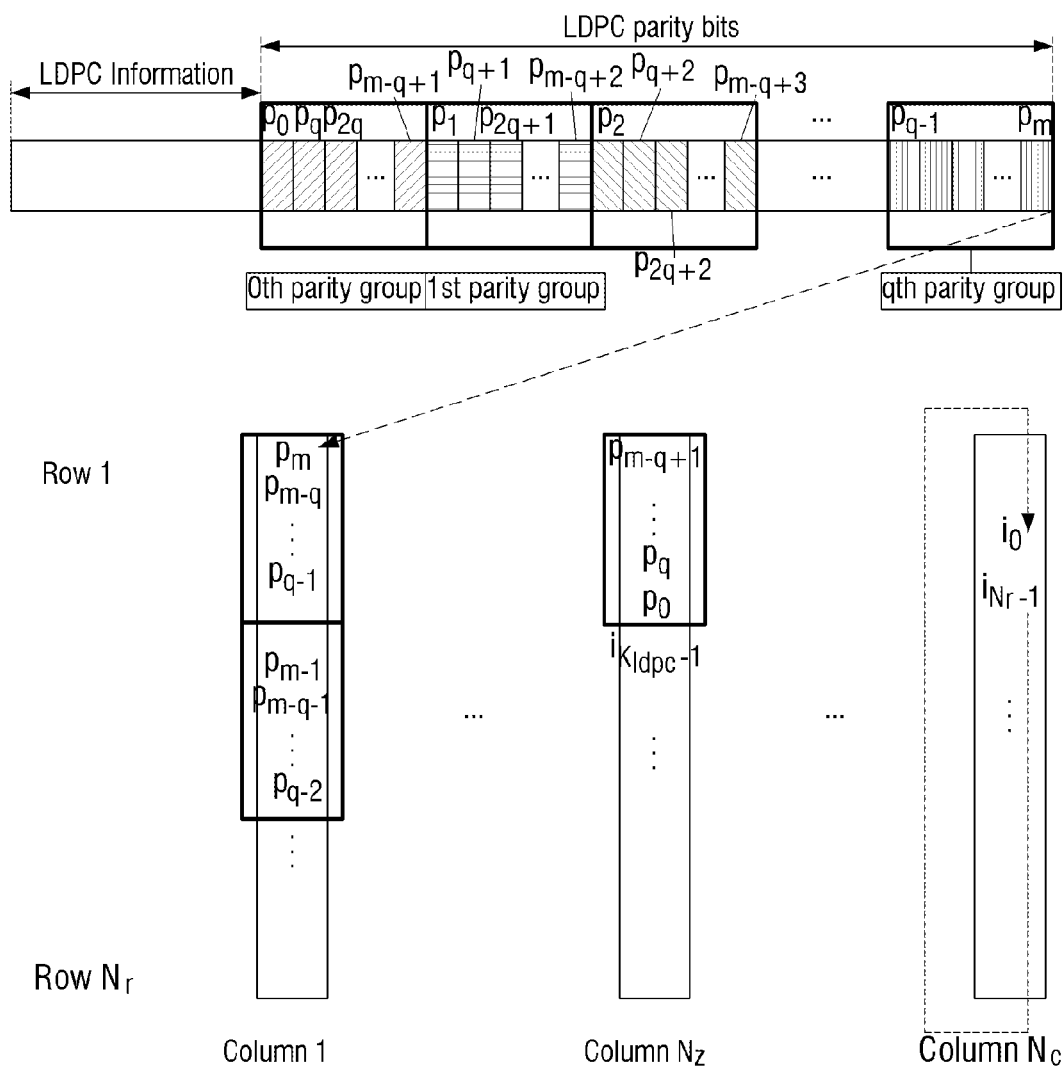

For example, as shown in FIG. 8, if parity bit $p_0$ is written in a column $N_z$, the bit interleaver 120 may sequentially write information bits $i_{k_{ldpc}-1}$, $i_{k_{ldpc}-2}$, ... from a row next to a row in which the parity bit $p_0$ is written.

If bits are written in all rows of one column, the bit interleaver 120 may write information bits from an arbitrary row of a next column in a reverse order. If information bits are written in a last row of a corresponding column, the bit interleaver 120 may write the information bits from a first row of the corresponding column in a reverse order.

According to the above-described method, the bit interleaver 120 may write all of information bits in each column.

As described above, according to an exemplary embodiment, parity bits may be written in each column by groups. Here, since each group includes parity bits arranged at the interval $Q_{ldpc}$ (=q) if the LDPC codeword was generated based on the parity check matrix 10 of FIG. 2A, parity bits included in one same group may be regarded as parity bits having low correlations.

If bits are written in each column according to the method described with reference to FIG. 7 or 8, the bit interleaver 120 may read bits written in each column in a row direction to perform interleaving.

Here, the bit interleaver 120 may classify a predetermined number of rows of a plurality of columns into a same row group and read bits written in each row group in a predetermined order. Here, the predetermined number may be M.

In other words, since parity bits arranged in M rows in one column are parity bits that belong to the same group and are also parity bits arranged at the interval $Q_{ldpc}$, if the LDPC codeword was generated based on the parity check matrix 10 of FIG. 2A, the parity bits may be regarded as parity bits having low correlations.

In detail, the bit interleaver 120 may read bits written in a plurality of rows of an arbitrary row group, and then read bits written in a plurality of rows of a row group which include parity bits having low correlations with parity bits of the read row group.

Figure 9:
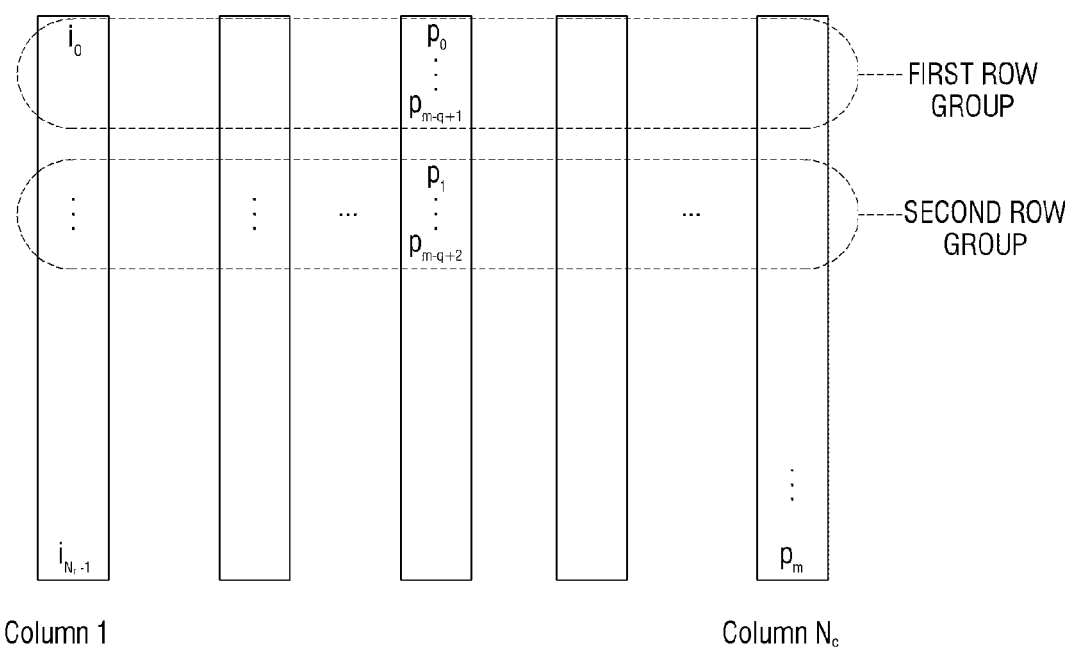

For example, as shown in FIG. 9, the bit interleaver 120 may classify each M rows into a same row group and sequentially read bits written in a plurality of rows of first one of a plurality of row groups. The bit interleaver 120 may determine a row group including parity bits having low correlations with the parity bits of the first group.

The bit interleaver 120 may respectively allocate indexes to row groups and apply a bit-reverse order to each of the indexes to determine a row group including parity bits having the lowest correlations with parity bits included in a previously read row group.

The bit interleaver 120 may sequentially read bits written in each row of a row group including parity bits having low correlations.

The bit interleaver 120 may repeatedly perform the above-described method to read all of bits written in a plurality of column.

If a reading operation is performed as described above, a possibility that parity bits having correlations will be mapped on the same OFDM symbol is more lowered than when rows are sequentially read. Therefore, an LDPC decoding performance may be further improved.

Figure 10:
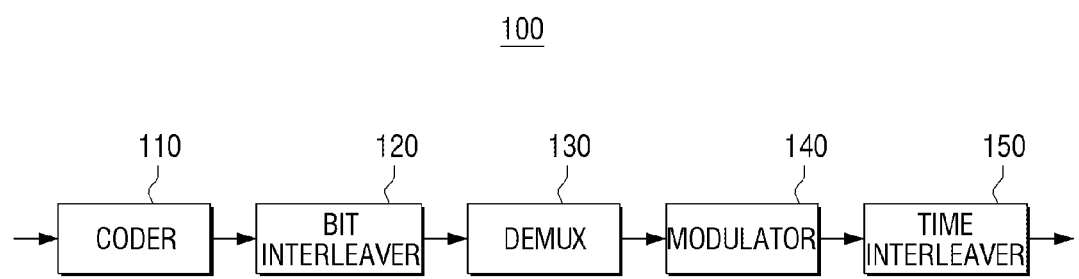
FIG. 10 is a block diagram illustrating a detailed structure of a transmitting apparatus according to an exemplary embodiment.

FIG. 10 is a block diagram illustrating a detailed structure of a transmitting apparatus 100 according to an exemplary embodiment. Referring to FIG. 10, the transmitting apparatus 100 includes an encoder 110, a bit interleaver 120, a DEMUX (demultiplxer) 130, a modulator 140, and a time interleaver 150. Here, the encoder 110 and the bit interleaver 120 perform functions as described with reference to FIGS. 1 to 9, and thus their repeated descriptions are omitted.

The DEMUX 130 demultiplexes bits of an interleaved LDPC codeword and outputs the demultiplexed bits to the modulator 140.

In detail, the DEMUX 130 performs a serial-to-parallel conversion on the interleaved LDPC codeword to covert the interleaved LDPC codeword into a parallel sequence (or cell) having a predetermined number of bits and outputs the parallel sequence. Here, the number of bits constituting the parallel sequence may be equal to the number of bits constituting a modulation symbol.

Figure 11:
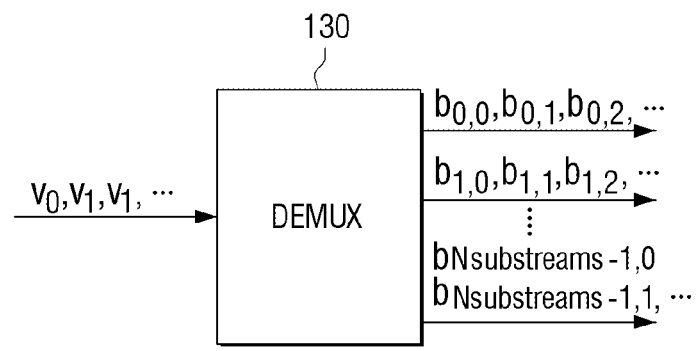
FIG. 11 is a block diagram illustrating a DEMUX according to an exemplary embodiment.

For example, as shown in FIG. 11, the DEMUX 130 receives an interleaved LDPC codeword V=[$v_0$, $v_1$, $v_2$, ...], sequentially outputs input bits to one of a plurality of substreams, converts input LDPC codeword bits into a parallel sequence, and outputs the parallel sequence. Here, bits having the same index in the plurality of substreams may constitute the same parallel sequence. In other words, the parallel sequence may be ($b_{0,0}$, $b_{1,0}$, $b_{N_{substreams}-1,0}$), ($b_{0,1}$, $b_{1,1}$, ..., $b_{N_{substreams}-1,1}$), ..., and ($b_{0,do}$, $b_{1,do}$, ..., $b_{N_{substreams}-1,do}$).

A detailed method of demultiplexing LDPC codeword bits $v_{di}$ input into the DEMUX 130 into $b_{e,do}$ will be defined as follows.

do=di div $N_{substreams}$ e: index of substream (0≤e<$N_{substreams}$)

$v_{di}$: bits input into DEMUX 130 di: indexes of bits input into DEMUX 130

$b_{e,do}$: bits output from DEMUX 130 do: indexes of bits constituting each substream

In detail, the DEMUX 130 may demultiplex the input bits $v_{di}$ into $b_{e,do}$ with reference to the above-described parameters and Table 1 below.

TABLE 1

| Modulation format | QPSM | | | | | | | | | | | |
|---|---|---|---|---|---|---|---|---|---|---|---|---|
| input bit | 0 | 1 | | | | | | | | | | |
| di mod $N_{substreams}$ output bit-number | 0 | 1 | | | | | | | | | | |
| Modulation format | 16 QAM | | | | | | | | | | | |
| input bit | 0 | 1 | 2 | 3 | | | | | | | | |
| di mod $N_{substreams}$ output bit-number | 0 | 2 | 1 | 3 | | | | | | | | |
| Modulation format | 64 QAM | | | | | | | | | | | |
| input bit | 0 | 1 | 2 | 2 | 4 | 5 | | | | | | |
| di mod $N_{substreams}$ output bit-number | 0 | 3 | 1 | 4 | 2 | 5 | | | | | | |
| Modulation format | 256 QAM | | | | | | | | | | | |
| input bit | 0 | 1 | 2 | 3 | 4 | 5 | 6 | 7 | | | | |
| di mod $N_{substreams}$ output bit-number | 0 | 4 | 1 | 5 | 2 | 6 | 3 | 7 | | | | |
| Modulation format | 1024 QAM | | | | | | | | | | | |
| input bit | 0 | 1 | 2 | 3 | 4 | 5 | 6 | 7 | 8 | 9 | | |
| di mod $N_{substreams}$ output bit-number | 0 | 5 | 1 | 6 | 2 | 7 | 3 | 5 | 4 | 9 | | |
| Modulation format | 4096 QAM | | | | | | | | | | | |
| input bit | 0 | 1 | 2 | 3 | 4 | 5 | 6 | 7 | 8 | 9 | 10 | 11 |
| di mod $N_{substreams}$ output bit-number | 0 | 6 | 1 | 7 | 2 | 6 | 3 | 9 | 4 | 10 | 5 | 11 |

For example, if a modulation method is 16-QAM, and $N_{substreams}=4$, the DEMUX 130 may output bits of sequentially input bits having index i satisfying i mod 4=0 as a $0^{th}$ substream, output bits having index i satisfying i mod 4=1 as a second substream, output bits having index i satisfying i mod 4=2 as a first substrate, and output bits having index i satisfying i mod 4-3 as a third substream. Therefore, the bits of the input LDPC $V=(v_0, v_1, v_2, \ldots)$ may be output as $(b_{0,0}, b_{1,0}, b_{2,0}, b_{3,0})=(v_0, v_2, v_1, v_3)$, $(b_{0,1}, b_{1,1}, b_{2,1}, b_{3,1})=(v_4, v_6, v_5, v_7), \ldots$.

The number of substreams may be equal to the number of bits constituting a modulation symbol as in Table 2 below.

TABLE 2

| Modulation Method | Number of substreams ($N_{substreams}$) |
|---|---|
| QPSK | 2 |
| 16-QAM | 4 |
| 64-QAM | 6 |
| 256-QAM | 8 |
| 1024-QAM | 10 |
| 4096-QAM | 12 |

However, this is only an example, and a substream into which input bits are demultiplexed may be determined based on various rules.

As described above, the DEMUX 130 may additionally rearrange bits constituting the interleaved LDPC codeword.

The modulator 140 maps the demultiplexed LDPC codeword on a modulation symbol.

In detail, the modulator 140 may modulate bits output from the DEMUX 130 by using various modulation methods such as QPSK, 16-QAM, 64-QAM, 256-QAM, 1024-QAM, 4096-QAM, etc.

Since the DEMUX 130 outputs a parallel sequence including the same number of bits as the number of modulation symbols, the modulator 140 may sequentially map each parallel sequence output from the DEMUX 130 on a modulation symbol. Here, the modulation symbol may correspond to a constellation point on a constellation and may be expressed as $(b_{0,do}, b_{1,do}, \ldots, b_{N_{substreams}-1,do})=(y_{0,do}, y_{1,do}, \ldots, y_{\eta\ mod,do})$. Here, η mod denotes the number of bits constituting the modulation symbol. Therefore, if the modulation method is QPSK, 16-QAM, 64-QAM, 256-QAM, 1024-QAM, or 4096-QAM, η mod may be 2, 4, 6, 8, 10, or 12.

The time interleaver 150 interleaves cells corresponding to several LDPC codewords in the unit of time. Here, the cells may be the modulation symbols output from the modulator 140. In other words, the time interleaver 150 may rearrange an order of cells generated from one LDPC codeword and an order of cells generated from another LDPC codeword in the unit of time.

Referring to FIG. 10, the transmitting apparatus 100 does not include a cell interleaver (not shown). Here, the cell interleaver interleaves cells generated from one LDPC codeword to rearrange orders of the cells generated from the one LDPC codeword.

In other words, according to an exemplary embodiment, the bit interleaver 120 may interleave bits of an LDPC codeword to form at least one modulation symbol of bits having low correlations in order to map the modulation symbol on the same OFDM symbol. Therefore, although the transmitting apparatus 100 does not additionally include the cell interleaver, the transmitting apparatus 100 may acquire the same effect as that acquired by the cell interleaver.

Although not shown in FIGS. 1 and 10, the transmitting apparatus 100 may further include a module (not shown) that maps cells constituting a modulation symbol on an OFDM symbol to constitute an OFDM frame and transmit the OFDM frame to a receiving apparatus 1200.

The transmitting apparatus 100 may also include at least one of elements that are defined in the DVB-T2 standards or Advanced Television Systems Committee (ATSC 3.0) standards that are currently established. The DVB-T2 standards are well known, and thus their detailed descriptions are omitted. The encoder 110, the bit interleaver 120, the DEMUX 130, the modulator 140, and the time interleaver 150 of FIG. 10 may respectively correspond to FEC encoding, a bit interleaver, Demux bits to cells, map cells to constellations, and a time interleaver.

Figure 12:
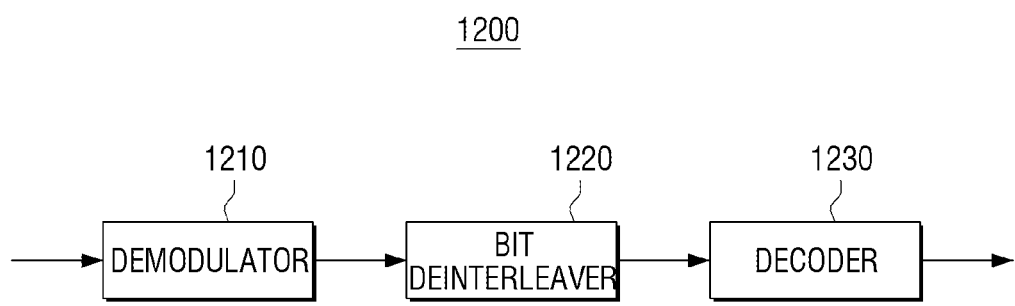
FIG. 12 is a block diagram illustrating a structure of a receiving apparatus according to an exemplary embodiment.

FIG. 12 is a block diagram illustrating a structure of the receiving apparatus 1200 according to an exemplary embodiment. Referring to FIG. 12, the receiving apparatus 1200 includes a demodulator 1210, a deinterleaver 1220, and a decoder 1230.

The demodulator 1210 receives and modulates a signal transmitted from the transmitting apparatus 100.

In detail, the demodulator 1210 demodulates a received signal to generate a value corresponding to an LDPC codeword. In other words, the demodulator 1210 determines a value corresponding to bits of the LDPC codeword that are mapped on a modulation symbol of the received signal.

The value corresponding to the LDPC codeword may be expressed as a channel value of the received signal. Here, a method of determining the channel value may be various, for example, a method of determining a log likelihood ratio (LLR) may be used.

Here, the LLR may be expressed by logging a ratio between a probability that a bit transmitted from the transmitting apparatus 100 will be 0 and a probability that the bit will be 1. Alternatively, the LLR may be a bit value that is determined according to a hard decision or may be a representative value that is determined according to a section to which the probability that the bit will be 0 or 1.

It is likely that parity bits of the received signal having low correlations may be mapped on at least one modulation symbol. This has been described in detail in the description of the transmitting apparatus 100.

The bit deinterleaver 1220 deinterleaves a signal received from the demodulator 1210 (i.e., an output value of the demodulator 1210).

The bit deinterleaver 1220 may be an element corresponding to the bit interleaver 120 of the transmitting apparatus 100 and reversely performs operations performed by the bit interleaver 120.

In detail, the bit deinterleaver 1220 may write the value corresponding to the LDPC codeword in a plurality of rows in a row direction and read columns of the plurality of rows in a column direction to perform deinterleaving. Here, the value corresponding to the LDPC codeword may be an LLR.

The bit deinterleaver 1220 may perform deinterleaving by using information about a position in at least one of columns of a plurality of rows, received from the transmitting apparatus 100, where the value corresponding to the LDPC codeword starts to be read.

In other words, as described above, the bit interleaver 120 adjusts a position of each column in which bits are first written, to arrange parity bits of a predetermined group in predetermined positions of a plurality of columns when performing interleaving. Therefore, when the deinterleaver 1220 reads the value corresponding to the LDPC codeword from each column of a plurality of rows to allow the receiving apparatus 1200 to restore an original signal, the transmitting apparatus 100 may transmit information about a position in which reading starts from at least one column to the receiving apparatus 1200. As a result, the bit deinterleaver 1220 may determine a position of a row in which reading starts in at least one column based on the received information and read the value corresponding to the LDPC codeword from the corresponding position to deinterleave the value corresponding to the LDPC codeword to arrange bits of the LDPC codeword in the same order as that before the bit interleaver 120 performs interleaving.

The decoder 1230 decodes a signal received from the bit deinterleaver 1220 (i.e., an output value of the bit deinterleaver 1220).

The decoder 1230 may be an element corresponding to the encoder 110 of the transmitting apparatus 100 and reversely performs operations performed by the encoder 110.

In detail, the decoder 1230 decodes the LDPC codeword by using the value corresponding to the deinterleaved LDPC codeword. Here, the value corresponding to the LDPC codeword may be an LLR.

The decoder 1230 may perform LDPC-decoding by using an iterative decoding algorithm based on a sum-product algorithm on a bipartite graph. The sum-product algorithm is a kind of message passing algorithm. The message passing algorithm refers to an algorithm that exchanges messages through an edge on the bipartite graph and calculates an output message from messages input into parameter nodes or check nodes to update the messages.

The decoder 1230 may perform decoding based on the parity check matrix 10 or 20 of FIG. 2A or 2B. In other words, the decoder 1230 may generate the bipartite graph based on the parity check matrix 10 or 20 of FIG. 2A or 2B and exchange an LLR on the bipartite graph to decode the LDPC codeword.

Although not shown in FIG. 12, the receiving apparatus 1200 may further include a MUX (not shown) that is disposed between the decoder 1210 and the bit deinterleaver 1220.

The MUX is an element corresponding to the DEMUX 130 of the transmitting apparatus 100 and reversely performs operations performed by the DEMUX 130.

In other words, the MUX performs a parallel-to-serial conversion on the value corresponding to the LDPC codeword output from the decoder 1210 to multiplex the value corresponding to the LDPC codeword. Here, the value corresponding to the LDPC codeword may be an LLR.

Although not described in the above exemplary embodiments, various types of elements of the transmitting apparatus 100 and the receiving apparatus 1200 including those illustrated in FIGS. 10 and 12 may be realized as hardware, software or a combination of hardware and software.

The transmitting apparatus 100 and the receiving apparatus 1200 may also include an additional memory (not shown) that stores a parity check matrix used for LDPC encoding and LDPC decoding.

Figure 13:
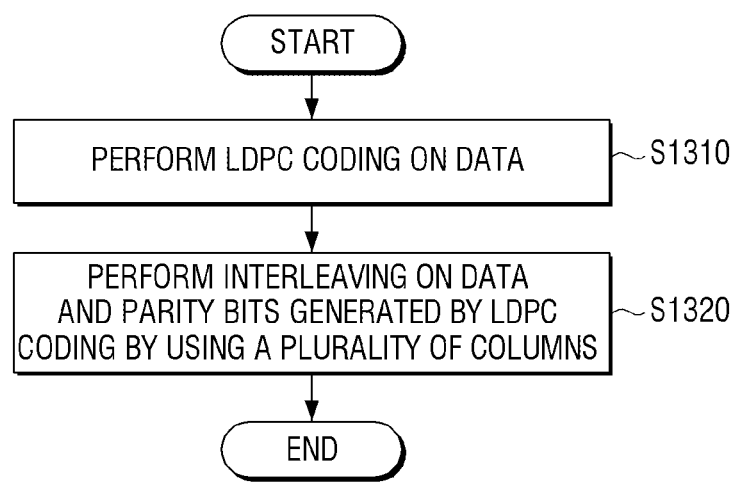
FIG. 13 is a flowchart illustrating an interleaving method according to an exemplary embodiment.

FIG. 13 is a flowchart of an interleaving method of a transmitting apparatus according to an exemplary embodiment.

In operation S1310, the transmitting apparatus performs LDPC encoding.

In operation S1320, the transmitting apparatus performs interleaving on data and parity bits generated by the LDPC encoding by using a plurality of columns. In this case, the transmitting apparatus may write the data and the parity bits in a column direction to perform interleaving in order to arrange parity bits of a predetermined group in predetermined positions of a plurality of columns.

In detail, the transmitting apparatus may write the data and the parity bits in a plurality of columns to arrange parity bits arranged at a preset interval after the LDPC encoding in first rows of a plurality of columns. In this case, the transmitting apparatus may adjust a start position in a column in which an information bit of the data and/or a parity bit is first written, to arrange the parity bits arranged at the preset interval in the first rows of the plurality of columns.

In operation S1320, the transmitting apparatus may sequentially write the data in the plurality of columns. and then sequentially write the parity bits in the plurality of columns. Alternatively, the transmitting apparatus may sequentially write the parity bits in the plurality of columns in a reverse order, and then sequentially write the data in the plurality of columns in a reverse order.

Figure 14:
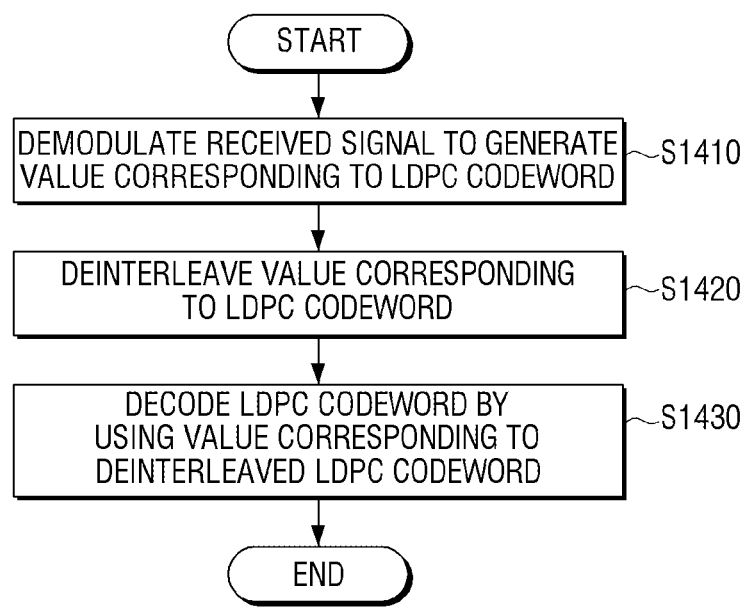
FIG. 14 is a flowchart illustrating a deinterleaving method according to an exemplary embodiment.

FIG. 14 is a flowchart of a deinterleaving method of a receiving apparatus according to an exemplary embodiment.

In operation S1410, the receiving apparatus demodulates a received signal to generate a value corresponding to an LDPC codeword. Here, the value corresponding to the LDPC codeword may be a channel value of the received signal, for example, may be an LLR.

In operation S1420, the receiving apparatus writes the value corresponding to the LDPC codeword in a plurality of rows in a row direction and perform reading from columns of the plurality of rows in a column direction to perform deinterleaving the value to output the LDPC codeword.

In detail, the receiving apparatus may perform reading from a predetermined position in at least one of columns of the plurality of rows in a column direction to perform deinterleaving. In this case, the receiving apparatus may perform deinterleaving by using information about the position in at least one of the columns of the plurality of rows, received from the transmitting apparatus 100, in which reading of the value corresponding to the LDPC codeword starts.

In operation S1430, the receiving apparatus decodes the LDPC codeword generated by the deinterleaving at S1420.

In detail, the receiving apparatus may perform LDPC-decoding by using an iterative decoding algorithm based on a sum-product algorithm on a bipartite graph and use the parity check matrix 10 or 20 of FIG. 2A or 2B.

According to the various exemplary embodiments as described above, an LDPC encoding performance may be improved.

There may be provided a non-transitory computer-readable medium that stores a program that sequentially performs the interleaving method and the deinterleaving method according to the above exemplary embodiments.

The non-transitory computer-readable medium refers to a medium which does not store data for a short time such as a register, a cache memory, a memory, or the like but semi-permanently stores data and is readable by a device. In detail, the above-described applications or programs may be stored and provided on a non-transitory computer readable medium such as a compact disc (CD), a digital versatile disc (DVD), a hard disk, a blue-ray disk, a universal serial bus (USB), a memory card, a read-only memory (ROM), or the like.

A bus is not shown in the above-described block diagram illustrating a transmitting apparatus. However, elements of an electronic device may communicate with one another through the bus. Also, each device may further include a processor such as a central processing unit (CPU) that performs the above-described various operations, a microprocessor, or the like.

The foregoing exemplary embodiments and advantages are merely exemplary and are not to be construed as limiting. For example, the LDPC encoding may be replaced by another type of encoding. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A transmitting apparatus comprising:
an encoder configured to encode information bits to generate parity bits; and
a bit interleaver configured to interleave codeword bits comprising the information bits and the parity bits,
wherein the bit interleaver is configured to write the codeword bits in a plurality of columns in a column direction and read the codeword bits written in the plurality of columns in a row direction,
wherein the bit interleaver adjusts a starting position where the codeword bits are written on at least one of the plurality of columns such that parity bits which are disposed at predetermined intervals in the codeword bits are written on a same row in the plurality of columns, and
wherein the parity bits which are disposed at predetermined intervals in the codeword bits are bits with relatively low correlation from among the parity bits in the codeword bits.

2. The transmitting apparatus of claim 1, wherein the bit interleaver is configured to write the codeword bits in the plurality of columns such that the parity bits which are disposed at predetermined intervals in the codeword bits after the encoding and before the interleaving are written on the same row in the plurality of columns.

3. The transmitting apparatus of claim 2, wherein the same rows are first lows of columns where the parity bits which are disposed at predetermined intervals in the codeword bits are written, among the plurality of columns.

4. The transmitting apparatus of claim 2, wherein the predetermined interval is an integer multiple of a constant determined according to a coding rate of the encoding and a length of the codeword bits generated by the encoding.

5. The transmitting apparatus of claim 1, wherein the bit interleaver is configured to write the information bits among the codeword bits in the plurality of columns, and then write the parity bits among the codeword bits in the plurality of columns.

6. The transmitting apparatus of claim 1, wherein the bit interleaver is configured to write the parity bits among the codeword bits in the plurality of columns in a reverse order which is opposite to an order of the parity bits in the codeword bits output, and then write the information bits among the codeword bits in the plurality of columns in a reverse order which is opposite to an order of the information bits among the codeword bits.

7. A transmitting apparatus comprising:
an encoder configured to encode information bits to generate parity bits; and
a bit interleaver configured to perform interleaving by writing codeword bits comprising the information bits and the parity bits in a plurality of columns in a column direction and reading the written codeword bits from the plurality of columns in a row direction such that parity bits, which are disposed at predetermined intervals and have relatively low correlation from among the parity bits in the codeword bits, are written on a same row in the plurality of columns and are consecutively read out from the plurality of columns,
wherein the low correlation parity bits are bits which are less correlated to one another than parity bits arranged consecutively in the codeword bits after the encoding and before the interleaving, with regard to a same check node when the codeword bits are decoded at a receiving apparatus using a tanner graph, and
wherein the bit interleaver adjusts a starting position where the codeword bits are written on at least one of the plurality of columns such that the parity bits, which are disposed at predetermined intervals and have relatively low correlation from among the parity bits in the codeword bits, are written on a same row in the plurality of columns.

8. The transmitting apparatus of claim 7, further comprising a modulator configured to modulate the interleaved codeword bits,
  wherein the low correlation parity bits constitute one same modulation symbol in the modulating, and the consecutively disposed parity bits after the encoding and before the interleaving constitute different modulation symbols in the modulating.

9. A transmitting method at a transmitting apparatus, the method comprising:
  encoding information bits to generate parity bits; and
  interleaving codeword bits comprising the information bits and the parity bits by writing the codeword bits in a plurality of columns in a column direction and reading the codeword bits written in the plurality of columns in a row direction,
  wherein the interleaving comprises adjusting a starting position where the codeword bits are written on at least one of the plurality of columns such that parity bits which are disposed at predetermined intervals in the codeword bits are written on a same row in the plurality of columns, and
  wherein the parity bits which are disposed at predetermined intervals in the codeword bits are bits with relatively low correlation from among the parity bits in the codeword bits.

10. The transmitting method of claim 9, wherein the writing the codeword bits in the plurality of columns in the column direction comprises writing the codeword bits in the plurality of columns such that the parity bits which are disposed at predetermined intervals in the codeword bits after the encoding and before the interleaving are written on a same row in the plurality of columns.

11. The transmitting method of claim 10, wherein the same rows are first lows of columns where the parity bits which are disposed at predetermined intervals in the codeword bits are written, among the plurality of columns.

12. The transmitting method of claim 10, wherein the preset predetermined interval is an integer multiple of a constant determined according to a coding rate of the encoding and a length of the codeword bits generated by the encoding.

13. The transmitting method of claim 9, wherein the writing the codeword bits in the plurality of columns in the column direction comprises writing the information bits among the codeword bits in the plurality of columns, and then writing the parity bits among the codeword bits in the plurality of columns.

14. The transmitting method of claim 9, wherein the writing the codeword bits in the plurality of columns in the column direction comprises writing the parity bits among the codeword bits in the plurality of columns in a reverse order which is opposite to an order of the parity bits in the codeword bits, and then writing the information bits among the codeword bits in the plurality of columns in a reverse order which is opposite to an order of the information bits among the codeword bits.

15. A transmitting method at a transmitting apparatus, the method comprising:
  performing encoding on data comprising information bits to generate parity bits; and
  interleaving the information bits and the generated parity bits by writing codeword bits comprising the information bits and the parity bits in a plurality of columns in a column direction and reading the written codeword bits from the plurality of columns in a row direction such that parity bits, which are disposed at predetermined intervals and have relatively low correlation from among the parity bits in the codeword bits, are written on a same row in the plurality of columns and are consecutively read out from the plurality of columns,
  wherein the low correlation parity bits are bits which are less correlated to one another than parity bits arranged consecutively in the codeword bits after the encoding and before the interleaving, with regard to a same check node when the codeword bits are decoded at a receiving apparatus using a tanner graph, and
  wherein the interleaving comprises adjusting a starting position where the codeword bits are written on at least one of the plurality of columns such that the parity bits, which are disposed at predetermined intervals and have relatively low correlation from among the parity bits in the codeword bits, are written on a same row in the plurality of columns.

16. The transmitting method of claim 15, further comprising modulating the interleaved codeword bits,
  wherein the low correlation parity bits constitute one same modulation symbol in the modulating, and the consecutively disposed parity bits after the encoding and before the interleaving constitute different modulation symbols in the modulating.

17. A receiving apparatus comprising:
  a demodulator configured to demodulate a signal to generate a value corresponding to a codeword bits comprising information bits and parity bits;
  a bit deinterleaver configured to perform deinterleaving by writing values corresponding to the codeword bits in a plurality of rows and reading from a plurality of columns of the plurality of rows to perform deinterleaving, to output the codeword bits; and
  a decoder configured to decode the codeword bis,
  wherein the bit deinterleaver performs the deinterleaving by reading the codeword bits from a given position in at least one of the plurality of columns in a column direction, and
  wherein the given position is determined in interleaving the codeword bits by adjusting a starting position where the codeword bits are written on at least one of the plurality of columns such that parity bits which are disposed at predetermined intervals in the codeword bits are written on a same row in the plurality of columns, and
  wherein the parity bits which are disposed at predetermined intervals in the codeword bits are bits with relatively low correlation from among the parity bits in the codeword bits.

18. The receiving apparatus of claim 17, wherein the bit deinterleaver is configured to perform the deinterleaving by using information about the given position in the at least one of the columns which is received from a transmitting apparatus of the signal.

19. A receiving method at a receiving apparatus, the method comprising:
  demodulating a signal to generate a value corresponding to codeword bits comprising information bits and parity bits;
  perform deinterleaving by writing values corresponding to the codeword bits in a plurality of rows and reading the codeword bita from a plurality of columns of the plurality of rows to output the codeword bits; and
  decoding the codeword bits, wherein the reading is performed by reading from a given position in at least one of the plurality of columns in a column direction, and wherein the given position is determined in interleaving the codeword bits by adjusting a starting position where the codeword bits are written on at least one of the plurality of columns such that parity bits which are disposed at predetermined intervals in the codeword bits are written on a same row in the plurality of columns, and wherein the parity bits which are disposed at predetermined intervals in the codeword bits are bits with relatively low correlation from among the parity bits in the codeword bits.

20. The method of claim 19, wherein the deinterleaving is performed by using information about the given position in the at least one of the columns which is received from a transmitting apparatus of the signal.

\* \* \* \* \*